United States Patent
Lee et al.

(10) Patent No.: US 6,870,268 B2
(45) Date of Patent: Mar. 22, 2005

(54) INTEGRATED CIRCUIT DEVICES FORMED THROUGH SELECTIVE ETCHING OF AN INSULATION LAYER TO INCREASE THE SELF-ALIGNED CONTACT AREA ADJACENT A SEMICONDUCTOR REGION

(75) Inventors: Jae-Goo Lee, Seoul (KR); Gwan-Hyeob Koh, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/663,968

(22) Filed: Sep. 16, 2003

(65) Prior Publication Data

US 2004/0058522 A1 Mar. 25, 2004

Related U.S. Application Data

(62) Division of application No. 09/702,597, filed on Oct. 31, 2000, now Pat. No. 6,649,490.

(30) Foreign Application Priority Data

Mar. 17, 2000 (KR) ......................................... 2000-13702

(51) Int. Cl.[7] .............................................. H01L 29/40
(52) U.S. Cl. ..................................... 257/774; 257/734
(58) Field of Search ................................. 257/774, 734, 257/775

(56) References Cited

U.S. PATENT DOCUMENTS 4,897,703 A * 1/1990 Spratt et al. ................. 257/586
5,219,793 A 6/1993 Cooper et al.

FOREIGN PATENT DOCUMENTS

EP 0 747 946 A2 12/1996
WO WO01/45156 6/2001

OTHER PUBLICATIONS

Search Report, GB 0101467.9, Dec. 3, 2001, 5 pages.

* cited by examiner

Primary Examiner—Roy Potter
(74) Attorney, Agent, or Firm—Myers Bigel Sibley & Sajovec

(57) ABSTRACT

Integrated circuit devices and methods of manufacturing same are disclosed in which an insulation layer is selectively etched to increase the self-aligned contact area adjacent a semiconductor region. For example, a pair of interconnection patterns may be formed on a substrate with the substrate having a semiconductor region disposed between the interconnection patterns. An etch-stop layer may then be formed on the pair of interconnection patterns and the substrate followed by the formation of a sacrificial insulation on the pair of interconnection patterns and on the semiconductor region. The sacrificial insulation layer is then selectively etched to expose portions of the etch-stop layer that extend on the surfaces of the pair of interconnection patterns. Sidewall insulation spacers, which are made of a different material than the sacrificial insulation layer, may then be formed on sidewall portions of the pair of interconnection patterns in an upper gap region between the interconnection patterns and on a portion of the sacrificial insulation layer covering the semiconductor region. The portion of the sacrificial insulation layer that covers the semiconductor region may then be selectively etched, using the sidewall insulation spacers as an etching mask, to define recesses underneath the sidewall insulation spacers.

7 Claims, 23 Drawing Sheets

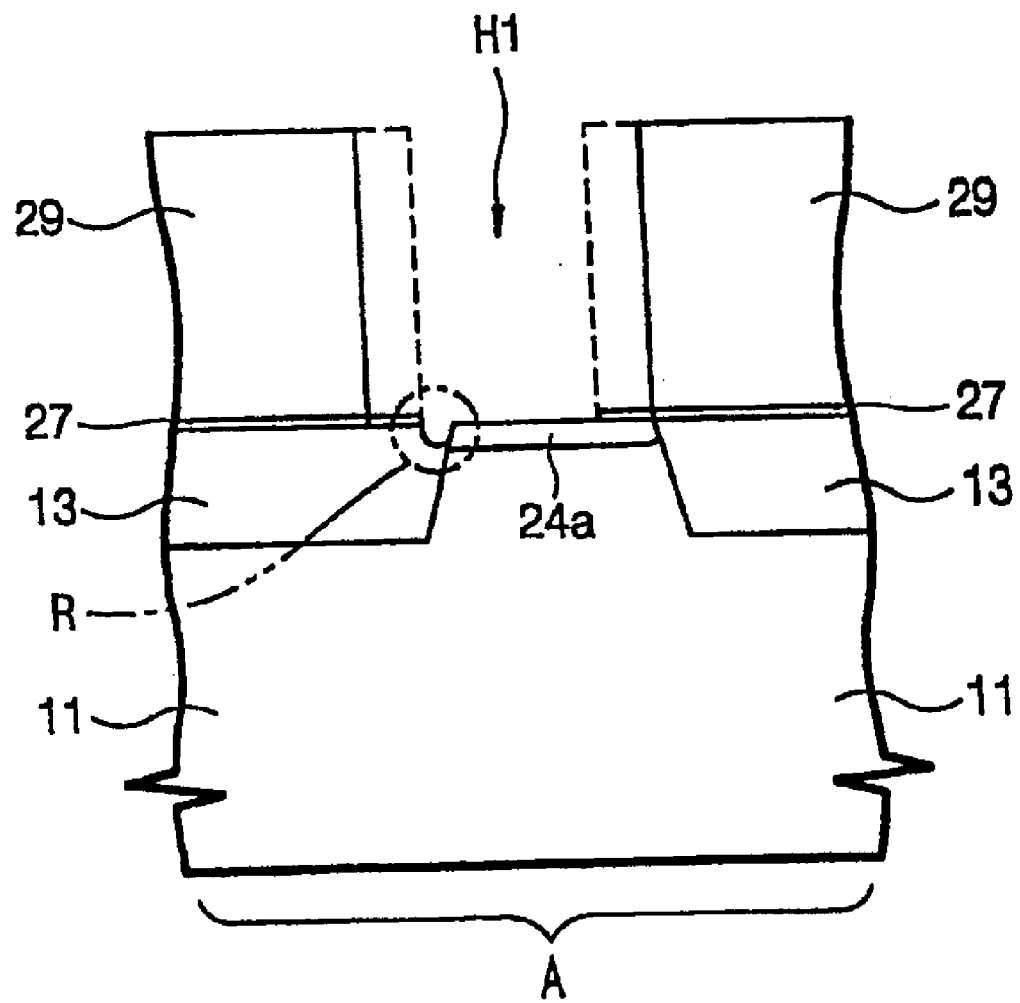

INTEGRATED CIRCUIT DEVICES FORMED THROUGH SELECTIVE ETCHING OF AN INSULATION LAYER TO INCREASE THE SELF-ALIGNED CONTACT AREA ADJACENT A SEMICONDUCTOR REGION

RELATED APPLICATION

This application claims priority to and is a divisional of parent application Ser. No. 09/702,597, filed Oct. 31, 2000, now U.S. Pat. No. 6,649,490 which claims the benefit of Korean Patent Application No. 2000-13702, filed Mar. 17, 2000, the disclosures of which are hereby incorporated herein by reference.

FIELD OF THE INVENTION

The present invention relates generally to manufacturing methods for integrated circuit devices and integrated circuit devices formed thereby and, more particularly, to manufacturing methods for integrated circuit devices having a self-aligned contact and integrated circuit devices formed thereby.

BACKGROUND OF THE INVENTION

As integrated circuit devices become more highly integrated and include finer geometries, the width and spacing between interconnections have also been reduced. Self-aligned contact technology has been used to increase alignment margins when using photolithography to form contact holes in predetermined regions between interconnections.

Referring now to FIG. 1, a cell array region of a DRAM device may include a plurality of active regions 1, which are formed in a semiconductor substrate and are repeatedly arranged along the X and Y axes. A plurality of parallel word line patterns 3 cross over the active regions 1, with one of the active regions 1' intersecting two of the word line patterns 3. A plurality of contact patterns 5 may be used to define self-aligned pad contact holes and are respectively arranged on one side of each of the active regions 1. Each of the contact patterns 5 may comprise an etching mask (i.e., a photoresist pattern), which may be used to form the self-aligned contact hole.

FIGS. 2–3, 4A, 4B, and 5–7 are cross-sectional views of the DRAM device of FIG. 1 that illustrate a conventional method that may be used to form a self-aligned contact structure. In each of the figures, the reference symbols "A" and "B" denote a memory cell region and a peripheral circuit region, respectively. The memory cell regions A of FIGS. 2–3, 4A, and 5–7 are cross-sectional views taken along line I—I of FIG. 1, and FIG. 4B is a cross-sectional view taken along line II—II of FIG. 1. To simplify the description, a single NMOS transistor is illustrated in the peripheral circuit region B.

Referring now to FIG. 2, a device isolation layer 13 is formed in a predetermined region of a semiconductor substrate 11 to define active regions therein. A gate oxide layer 15, a conductive layer 17, a capping insulation layer 19, and a hard mask layer 21 are sequentially formed on the entire surface of the resultant structure where the device isolation layer 13 is formed. The capping insulation layer 19 and the hard mask layer 21 are typically made from silicon nitride (SiN) and silicon oxide ($SiO_2$), respectively. The hard mask layer 21, the capping insulation layer 19, and the conductive layer 17 are successively patterned to form a plurality of word line patterns 23a on the active regions and the device isolation layer 13 in the memory cell region A and also to form a gate pattern 23b on the active region in the peripheral circuit region B. Accordingly, each of the word line patterns 23a comprises a word line 17a, a capping insulation layer pattern 19, and a hard mask pattern 21, which are sequentially stacked as shown. Similarly, each gate pattern 23b comprises a gate electrode 17b, a capping insulation layer pattern 19, and a hard mask pattern 21.

Using the word line patterns 23b, the gate pattern 23b, and the device isolation layer 13 as an ion implanting mask, N-type impurities are implanted into the active regions to form low concentration impurity regions 24, 24a, and 24b. In the memory cell region A, the low concentration impurity region 24b formed at a center of the active region corresponds to a common drain region. The low concentration impurity regions 24a correspond to source regions.

Referring now to FIG. 3, a silicon nitride (SiN) layer is formed on an entire surface of the resultant structure and is then anisotropically etched to form spacers 25 on the sidewalls of the word line patterns 23a and the gate pattern 23b. Using the gate pattern 23b, the spacers 25, and the device isolation layer 13 as ion implanting masks, N-type impurities are selectively implanted into the active region of the peripheral circuit region B, thereby forming LDD-typed source/drain regions 26 on opposing sides of the gate pattern 23b. Typically, the impurities are implanted using a high dose of approximately $1 \times 10^{15}$ ion atoms/$cm^2$.

An etch-stop layer 27 is then formed on the entire surface of the resultant structure. Typically, the etch-stop layer 27 comprises an insulator, such as silicon nitride (SiN). Next, an interlayer insulation layer 29 is formed on the entire surface of the resultant structure to fill gap regions between the word line patterns 23a as shown in FIG. 3. Typically, the interlayer insulation layer 29 is formed at a temperature of 800° C. or lower to prevent degradation of the MOS transistors. Specifically, the low concentration impurity regions 24a and 24b in the memory cell region A and the source/drain regions 26 in the peripheral circuit region B may be re-diffused to reduce the channel length of the transistors when the interlayer insulation layer 29 is made from borophosphosilicate glass (BSPG) that is re-flowed at a high temperature of approximately 850° C. to 950° C. The interlayer insulation layer 29 is, therefore, typically made of a high-density plasma (HDP) oxide that is capable of filling up the gap regions between the word line patterns 23a without voids at a temperature of 800° C. or lower. Furthermore, the interlayer insulation layer 29 is preferably more amenable to etching by a given etchant than the etch-stop layer 27.

When the interlayer insulation layer 29 is made of HDP oxide, however, the power of a high-density plasma apparatus must generally be increased to fill the gap regions between the word line patterns 23a. Unfortunately, if the etch-stop layer 27 has a thickness of approximately 200 Å or less, then reacting gas used for the high-density plasma process may infiltrate the etch-stop layer 27. As a result, the etch-stop layer 27 may tend to lift from the substrate 11. To suppress this lifting phenomenon, the etch-stop layer 27 may be formed to a thickness of at least 200 Å. But if the thickness of the etch-stop layer 27 is increased, then a lower width of a self-aligned contact hole, which is formed as described hereinafter, may be reduced. Accordingly, it may be difficult to optimize the thickness of the etch-stop layer 27.

Even though the interlayer insulation layer 29 is planarized, a global step difference S1 may be generated between the memory cell region A and the peripheral circuit region B as shown in FIG. 3. Specifically, an upper surface of the interlayer insulation layer 29 in the memory cell region A is lower than that of the peripheral circuit region B. The high-density plasma process, which comprises an alternated and repeated performance of a sputter etching process and a deposition process, may be a cause of the step difference S1. The sputter etching process may exhibit a more efficient etching characteristic in a protrusion region than in a plane region. As a result, the interlayer insulation layer 29 may be etched to a more thin thickness in the memory cell region A, which has a relatively high pattern density, than in the peripheral circuit region B.

Referring now to FIGS. 4A and 4B, a predetermined region of the interlayer insulation layer 29 in the memory cell region A is anisotropically etched using a photo mask on which the contact patterns 5, which are shown in FIG. 1, are drawn. The etch-stop layer 27 is then etched to form self-aligned pad contact holes H1 and H2, which expose the source regions 24a and the common drain region 24b in the memory cell region A. After etching the etch-stop layer 27 to form the pad contact holes H1 and H2, some etch-stop layer residue 27a may remain on a lower sidewall of the self-aligned pad contact holes H1 and H2. Unfortunately, increasing the thickness of the etch-stop layer 27 may also increase the width of the etch-stop layer residue 27a. This may reduce the exposed areas of the source regions 24a and the common drain region 24b, which may reduce an alignment margin between the word line patterns 23a and the active regions.

While performing the photolithographic process for defining the self-aligned pad contact holes H1 and H2, misalignment may also occur along the X-axis shown in FIG. 1. In this case, as shown in FIG. 4B, the source region 24a and the device isolation layer 13 that is adjacent thereto may be exposed by the self-aligned pad contact hole H1. If the interlayer insulation layer 29 is isotropically etched to increase the exposed area of the source regions 24a and the common drain region 24b, then an edge portion R of the exposed device isolation layer 13 may recess to expose a sidewall of a source region 24a. This may lead to an increase in junction leakage current between the semiconductor substrate 11 and a conductive pad filling the self-aligned pad contact hole.

Referring now to FIG. 5, a conductive layer 31 (e.g., a polysilicon layer) is formed on an the entire surface of the resultant structure shown in FIG. 4A in which the self-aligned pad contact holes H1 and H2 are formed. A global step difference S1 between the top surface of the conductive layer 31 in the memory cell region A and the top surface of the conductive layer 31 in the peripheral circuit region B may also be formed as shown in FIG. 5.

Referring now to FIG. 6, the conductive layer 31 and the interlayer insulation layer 29 are etched down to a top surface of the word line patterns 23a of the memory cell region A using, for example, a chemical mechanical polishing (CMP) process. As shown in FIG. 6, a top surface of the word line pattern 23a close to a center of the memory cell region A may be exposed earlier than that of a word line pattern 23a that is adjacent to the peripheral circuit region B. This may be caused by the global step difference S1, which is shown in FIG. 5, and a dishing phenomenon that may accompany the CMP process.

Referring now to FIG. 7, the CMP process used to etch the conductive layer 31 and the interlayer insulation layer 29 to form the electrically isolated conductive pads 31a and 31b in the holes H1 and H2, respectively, may also expose the word lines 17a as shown in FIG. 7. An upper interlayer insulation layer 33 is then formed on the surface of the resultant structure where the conductive pads 31a and 31b are formed. The upper interlayer insulation layer is then patterned to form storage node contact holes 35 that expose the conductive pads 31a, which are in contact with the source regions 24a.

As discussed hereinabove, it may be difficult to select a suitable thickness for the etch-stop layer 27 because if the etch-stop layer 27 is too thin, then it may lift from the substrate 11 during the HDP process of forming the interlayer insulation layer 29 and if the etch-stop layer 27 is too thick, then a lower width of the self-aligned pad contact holes H1 and H2 may be reduced. Moreover, it may also be difficult to reduce the contact pad resistance and increase alignment margins between the active regions and the word line patterns 23a and between the conductive pads 31a, 31b and the storage node contact holes 35.

SUMMARY OF THE INVENTION

Embodiments of the present invention may include integrated circuit devices and methods of manufacturing same in which an insulation layer is selectively etched to increased the self-aligned contact area adjacent a semiconductor region. For example, a pair of interconnection patterns may be formed on a substrate with the substrate having a semiconductor region disposed between the interconnection patterns. An etch-stop layer may then be formed on the pair of interconnection patterns and the substrate, followed by the formation of a sacrificial insulation on the pair of interconnection patterns and on the semiconductor region. The sacrificial insulation layer is then selectively etched to expose portions of the etch-stop layer that extend on the surfaces of the pair of interconnection patterns. Sidewall insulation spacers, which are made of a different material than the sacrificial insulation layer, may then be formed on sidewall portions of the pair of interconnection patterns in an upper gap region between the interconnection patterns and on a portion of the sacrificial insulation layer covering the semiconductor region. The portion of the sacrificial insulation layer that covers the semiconductor region may then be selectively etched, using the sidewall insulation spacers as an etching mask, to define recesses underneath the sidewall insulation spacers. Advantageously, alignment margins of the interconnection patterns may be increased.

In accordance with other embodiments of the present invention, the portion of the etch-stop layer that is exposed when the sacrificial insulation layer is selectively etched to define the recesses underneath the sidewall insulation spacers is etched. A conductive pad may then be formed between the interconnection patterns such that the conductive pad engages the semiconductor region. Because the gap between the pair of interconnection patterns is wider near the substrate due to the recesses defined underneath the sidewall insulation spacers, contact pad resistance may be reduced.

In particular embodiments of the present invention, when the portion of the sacrificial insulation layer covering the semiconductor region is etched to define recesses underneath the sidewall insulation spacers, the sacrificial insulation layer is maintained on the sidewalls of the interconnection patterns. The sacrificial insulation layer residue that remains on the sidewalls of the interconnection patterns may reduce parasitic capacitance between, for example, a word line and a capping insulation layer pattern that comprise each interconnection pattern. In accordance with other embodiments of the present invention, the sacrificial insulation layer is etched until it is removed from the sidewalls of the interconnection patterns.

In accordance with still other embodiments of the present invention, the etch-stop layer and the sidewall insulation spacers are formed of the same material, such as silicon nitride (SiN). Furthermore, the etch-stop layer is preferably formed to a thickness of approximately 200 Å to 1000 Å. The increased thickness of the etch-stop layer as compared to etch-stop layers typically used in conventional self-aligned contact technology may reduce the tendency for the etch-stop layer to lift from the substrate during formation of the sacrificial insulation layer. Moreover, the increased thickness of the etch-stop layer may protect the source region or drain region from damage when etching the sacrificial insulation layer from the lower gap region.

In accordance with other embodiments of the present invention, the sacrificial insulation layer may comprise a material selected from the group consisting of high density plasma (HDP) oxide, plasma-enhanced tetraethyl ortho silicate (PE-TEOS), and undoped silicate glass (USG). Moreover, the sacrificial insulation layer may be formed at a temperature less than approximately 800° C. Advantageously, re-diffusion of the semiconductor region may be reduced.

In accordance with further embodiments of the present invention, integrated circuit devices may be manufactured by forming an isolation layer in a substrate to define a memory cell region and a peripheral circuit region. A pair of word line patterns may be formed on the substrate in the memory cell region and a gate pattern may be formed in the peripheral circuit region. A sacrificial insulation layer may then be formed between the pair of word line patterns such that a gap between the pair of word line patterns is substantially filled. The sacrificial insulation layer is etched such that the sacrificial insulation layer fills a lower gap region that is near the substrate. An interlayer insulation layer is then formed on the memory cell region and the peripheral circuit region such that a distance from an upper surface of the interlayer insulation layer to the substrate surface in the memory cell region is greater than a distance from the upper surface of the interlayer insulation layer to the substrate in the peripheral circuit region. This step difference in the interlayer insulation layer between the memory cell region and the peripheral circuit region is caused by the sacrificial insulation layer that fills the lower gap region between the pair of word line patterns. Advantageously, the step difference may reduce the effects of dishing during subsequent chemical mechanical polishing (CMP) operations that are used to etch back a conductive layer and the interlayer insulation layer to create self-aligned conductive pads between the word line patterns.

In accordance with other embodiments of the present invention, the interlayer insulation layer may be etched from the memory cell region. In addition, the sacrificial insulation layer may be etched to expose the substrate between the word line patterns. A conductive layer may then be formed on the memory cell region and the peripheral circuit region such that a distance form an upper surface of the conductive layer to the substrate surface in the memory cell region is greater than a distance from the upper surface of the conductive layer to the substrate in the peripheral circuit region.

In accordance with still other embodiments of the present invention, the conductive layer in the memory cell region and the conductive layer and the interlayer insulation layer in the peripheral circuit region may be etched, for example, using CMP to form a conductive pad in the gap between the pair of word line patterns.

Thus, the present invention may be used to manufacture integrated circuit devices having increased alignment margins for interconnection patterns formed thereon. In addition, the present invention may be used to manufacture integrated circuit devices having a self-aligned contact that has improved contact pad resistance. Although the present invention has been described above primarily with respect to method aspects of the invention, it will be understood that the present invention may be embodied as methods and/or integrated circuit devices.

BRIEF DESCRIPTION OF THE DRAWINGS

Other features of the present invention will be more readily understood from the following detailed description of specific embodiments thereof when read in conjunction with the accompanying drawings, in which:

FIG. 4B is a second cross-sectional view taken along line II—II of FIG. 1 of the conventional integrated circuit memory device of FIG. 4A;

DETAILED DESCRIPTION OF PREFERRED EMBODIMENTS

Figure 1:
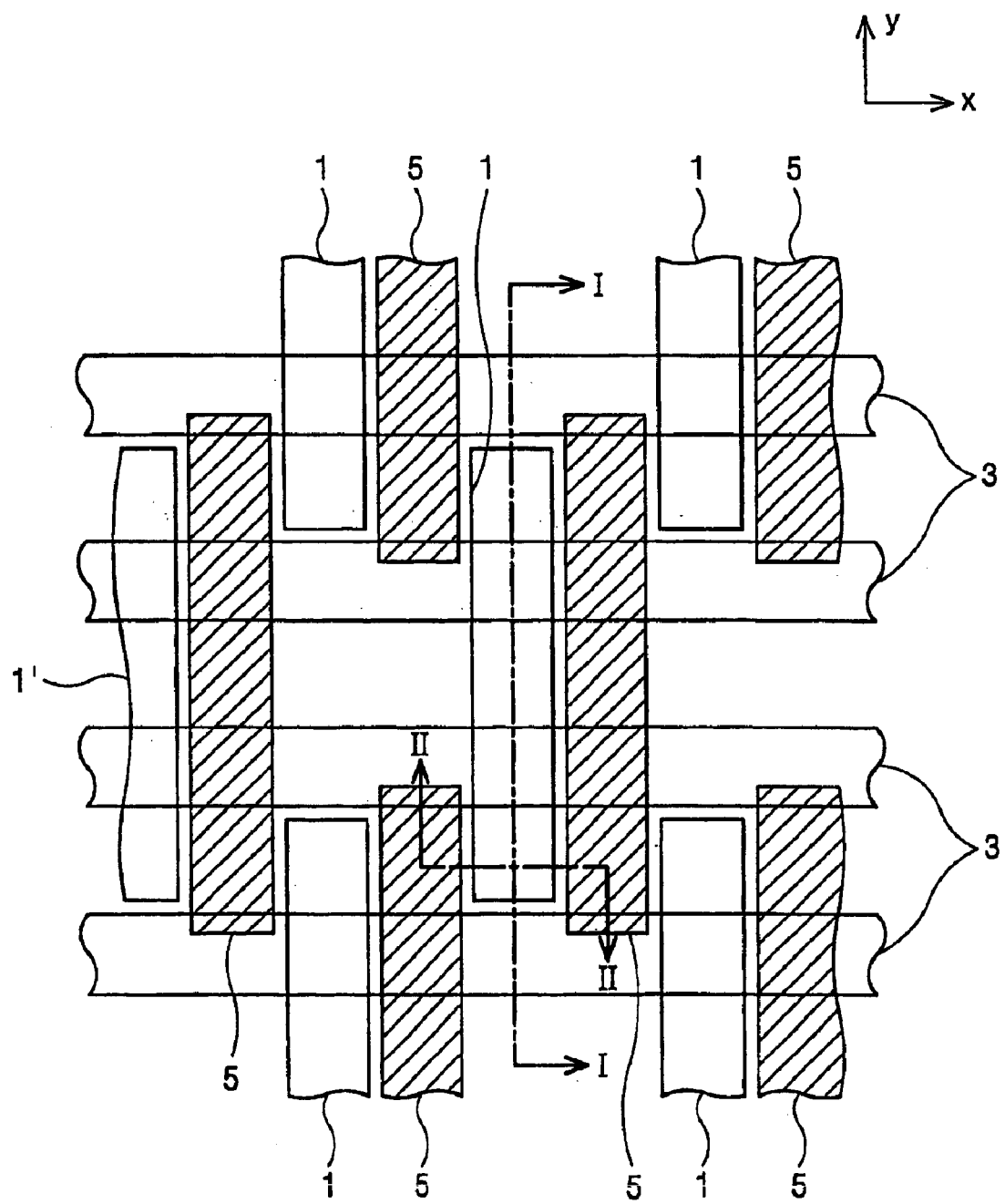
FIG. 1 is a layout diagram that illustrates a portion of a cell array region of an integrated circuit memory device.
Figure 2:
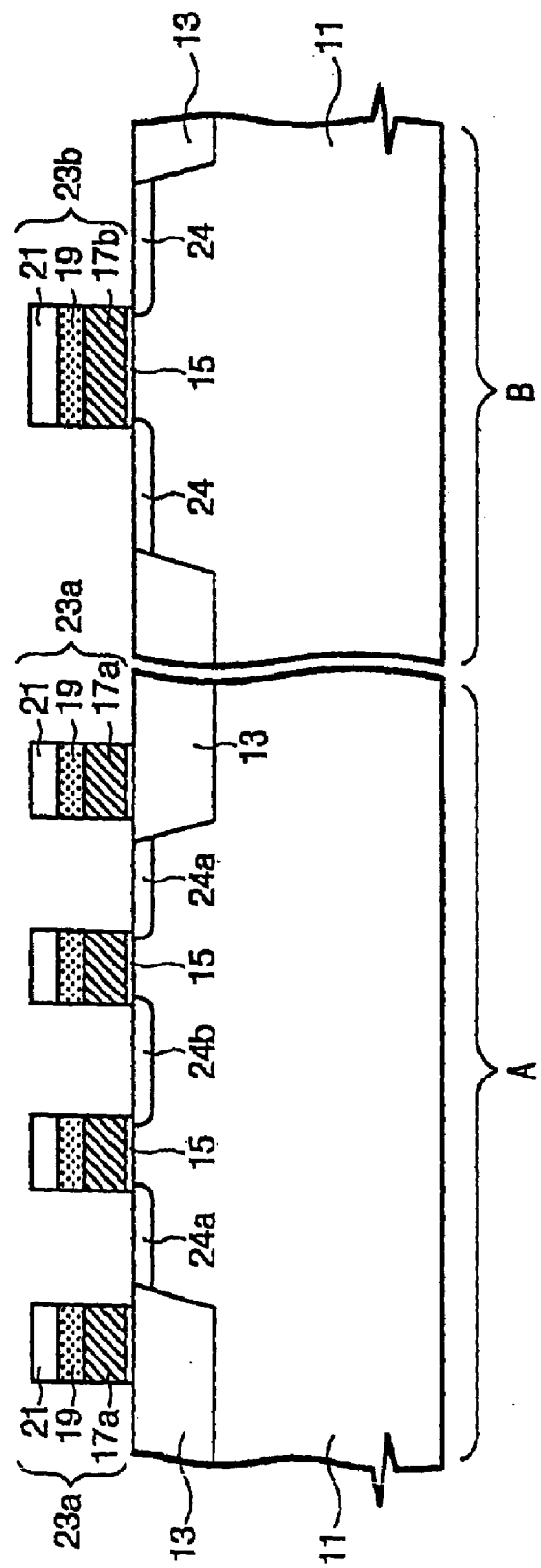
FIGS. 2, 3, 4A, 5, 6, and 7 are first cross-sectional views taken along line I—I of FIG. 1 of a conventional integrated circuit memory device in various stages of manufacture.

While the invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention as defined by the claims. In the drawings, the thickness of layers and regions are exaggerated for clarity. Like numbers refer to like elements throughout the description of the figures. Moreover, each embodiment described and illustrated herein includes its complementary conductivity type embodiment as well. It will also be understood that when a layer or region is referred to as being "on" another layer, region or substrate, it can be directly on the other layer, region or substrate, or intervening layers or regions may also be present. Conversely, when a layer or region is indicated as being "directly on" another layer, region or substrate; intervening layers or regions are not present.

With reference to FIGS. 1, 8–13, 14A, 14B, 15A, 15B, 16A, 16B, 17A, 17B, and 18, integrated circuit devices having a self-aligned contact structure and methods of manufacturing same in accordance with embodiments of the present invention will be described hereafter. In each of the figures, the reference symbols "A" and "B" denote a memory cell region and a peripheral circuit region, respectively. The memory cell regions A of FIGS. 8–13, 14A, 15A, 16A, and 17A are cross-sectional views taken along line I—I of FIG. 1, and FIGS. 14B, 15B, 16B, and 17B are cross-sectional views taken along line II—II of FIG. 1. To simplify the description, a single NMOS transistor is illustrated in the peripheral circuit region B.

Figure 8:
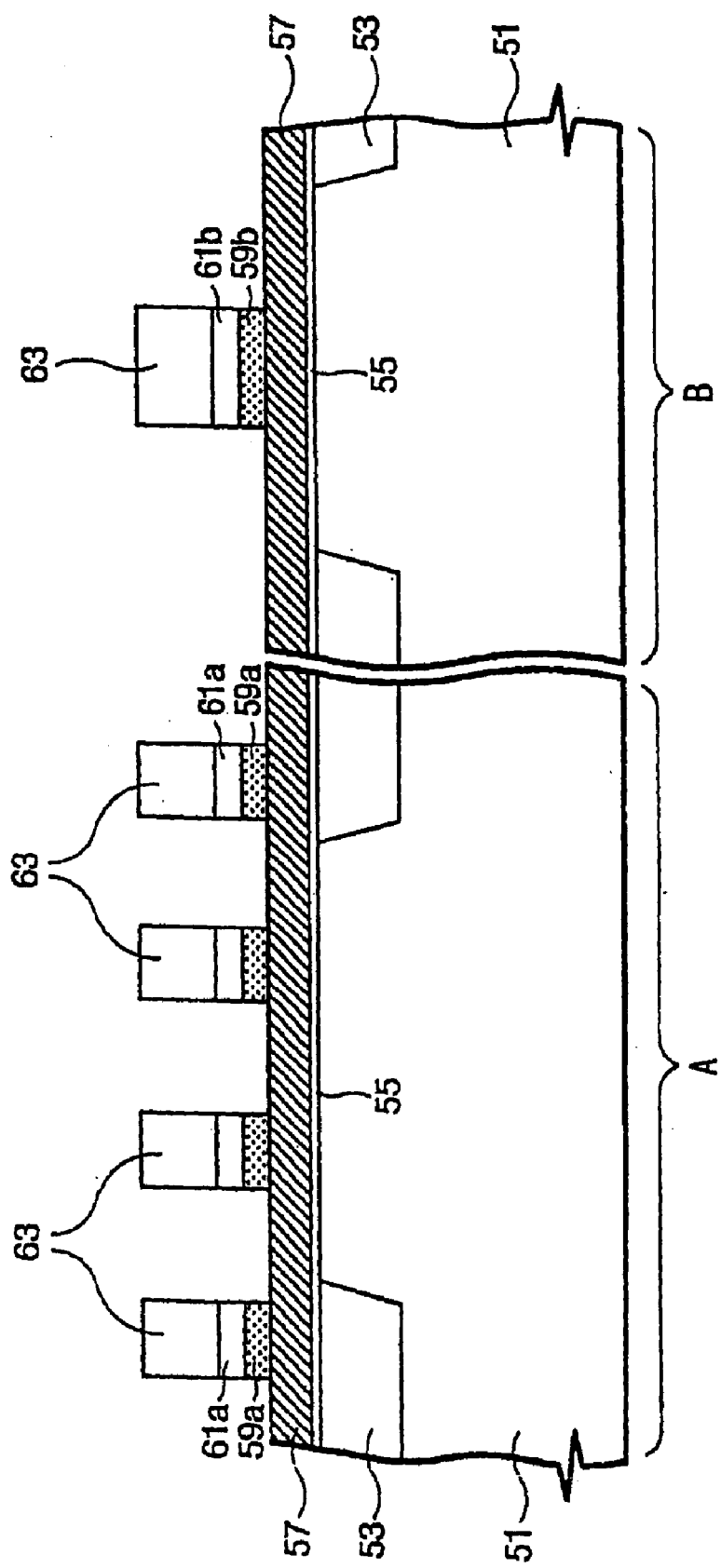
FIGS. 8–13, 14A, 15A, 16A, 17A are first cross-sectional views taken along line I—I of FIG. 1 of integrated circuit memory devices in various stages of manufacture in accordance with embodiments of the present invention.

Referring now to FIG. 8, a device isolation layer 53 is formed in a predetermined region of a semiconductor substrate 11, such as a P-type silicon substrate, to define active regions. The device isolation layer 53 may be formed using a photo mask on which the active region pattern 1 of FIG. 1 is drawn. The device isolation layer 53 may be formed using conventional isolation technology, such as local oxidation of silicon (LOCOS) technology or trench isolation technology. Next, a gate insulation layer 55 may be formed on the entire surface of the resulting structure where the device isolation layer 53 is formed. The gate insulation layer 55 may be formed using a conventional thermal oxidation process. A conductive layer 57 and a protection layer are then sequentially formed on the entire surface of the resultant structure where the gate insulation layer 55 is formed. The conductive layer 57 may be made of polysilicon or metal polycide. Preferably, the protection layer is formed by sequentially stacking a capping insulation layer and a hard mask layer. Alternatively, the protection layer may solely comprise the capping insulation layer. The capping insulation layer may comprise an insulator, such as silicon nitride (SiN), which is less amenable to etching by a given etchant than is silicon oxide ($SiO_2$), which may be used as an interlayer insulation layer. The hard mask layer may comprise an insulator, such as silicon oxide, which is more amenable to etching by a given etchant than is the capping insulation layer.

A first photoresist pattern 63 is then formed on the protection layer using a photo mask on which the word line pattern 3 of FIG. 1 is drawn. Note that the first photoresist pattern 63 may include a photoresist pattern covering a predetermined region of the peripheral circuit region B as shown in FIG. 8. Using the first photoresist pattern 63 as an etching mask, the protection layer is etched to form a protection layer pattern on a predetermined region of the conductive layer 57. As shown in FIG. 8, the protection layer pattern comprises capping insulation layer patterns 59a and 59b and hard mask patterns 61a and 61b, which are sequentially stacked one on top of the other. Furthermore, the protection layer patterns may be substantially parallel to each other in the memory cell region A.

Figure 9:
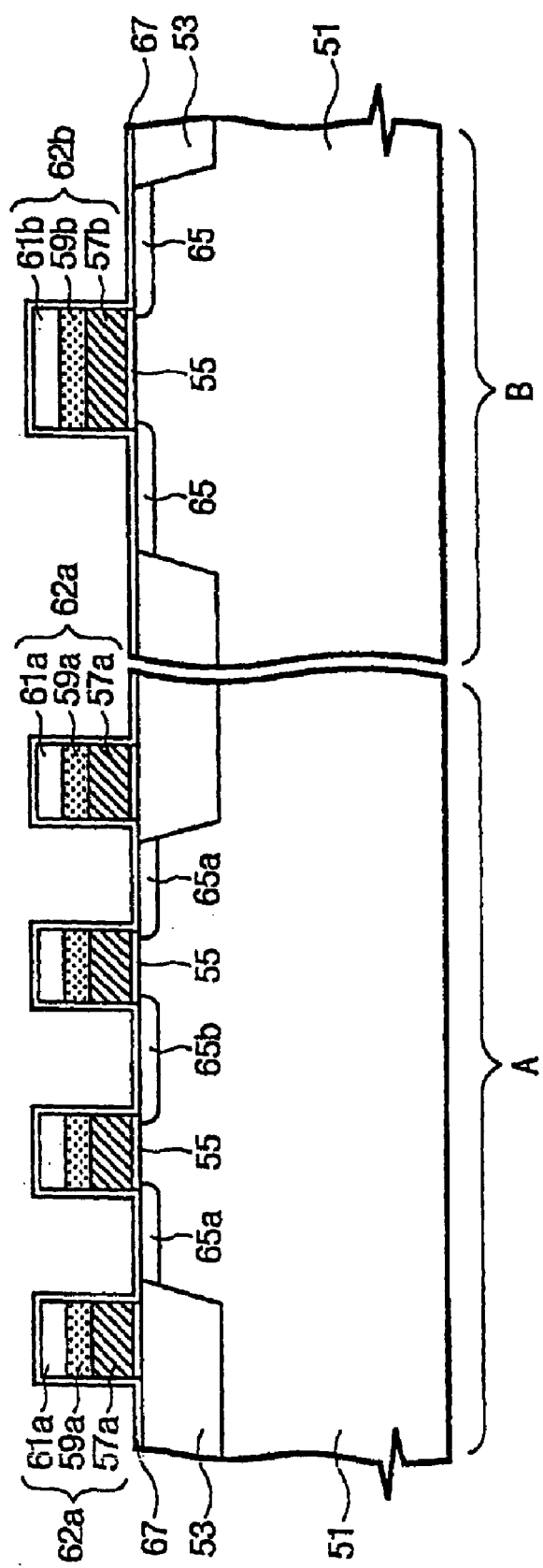

Referring now to FIG. 9, the first photoresist pattern 63 is removed and then, using the hard mask patterns 61a and 61b as etching masks, the conductive layer 57 is etched to form parallel word lines 57a, which cross over the active regions of the memory cell region A, and a gate electrode 57b, which crosses over the active region of the peripheral circuit region B. Although the operation of etching the conductive layer 57 typically removes the gate insulation layer 55 from the etched regions, portions of the gate insulation layer 55 may remain on the semiconductor substrate 51 between the word lines 57a and adjacent the gate electrode 57b. The word line 57a, the capping insulation layer pattern 59a, and the hard mask pattern 61a, which are sequentially stacked in the memory cell region A, may collectively comprise an interconnection pattern or word line pattern 62a. Similarly, the gate electrode 57b, the capping insulation layer pattern 59b, and the hard mask pattern 61b, which are sequentially stacked in the peripheral circuit region B, may collectively comprise a gate pattern 62b.

Using the word line patterns 62a and the gate pattern 62b as an ion implanting mask, N-type impurities, such as phosphorous ions, are implanted into the active regions with a low dose of approximately $1 \times 10^{12}$ to $1 \times 10^{14}$ ion atoms/$cm^2$ to form the semiconductor regions or low concentration impurity regions 65, 65a, and 65b. In the memory cell region A, the low concentration impurity region 65b formed at a center of the active region corresponds to a common drain region of a pair of cell transistors. The low concentration impurity regions 65a correspond to respective source regions of the pair of cell transistors. An etch-stop layer 67 is then formed on the entire surface of the resultant structure where the low concentration impurity regions 65, 65a, and 65b are formed. Preferably, the etch-stop layer 67 and the capping insulation layer patterns 59a and 59b comprise the same material, such as silicon nitride (SiN).

Figure 10:
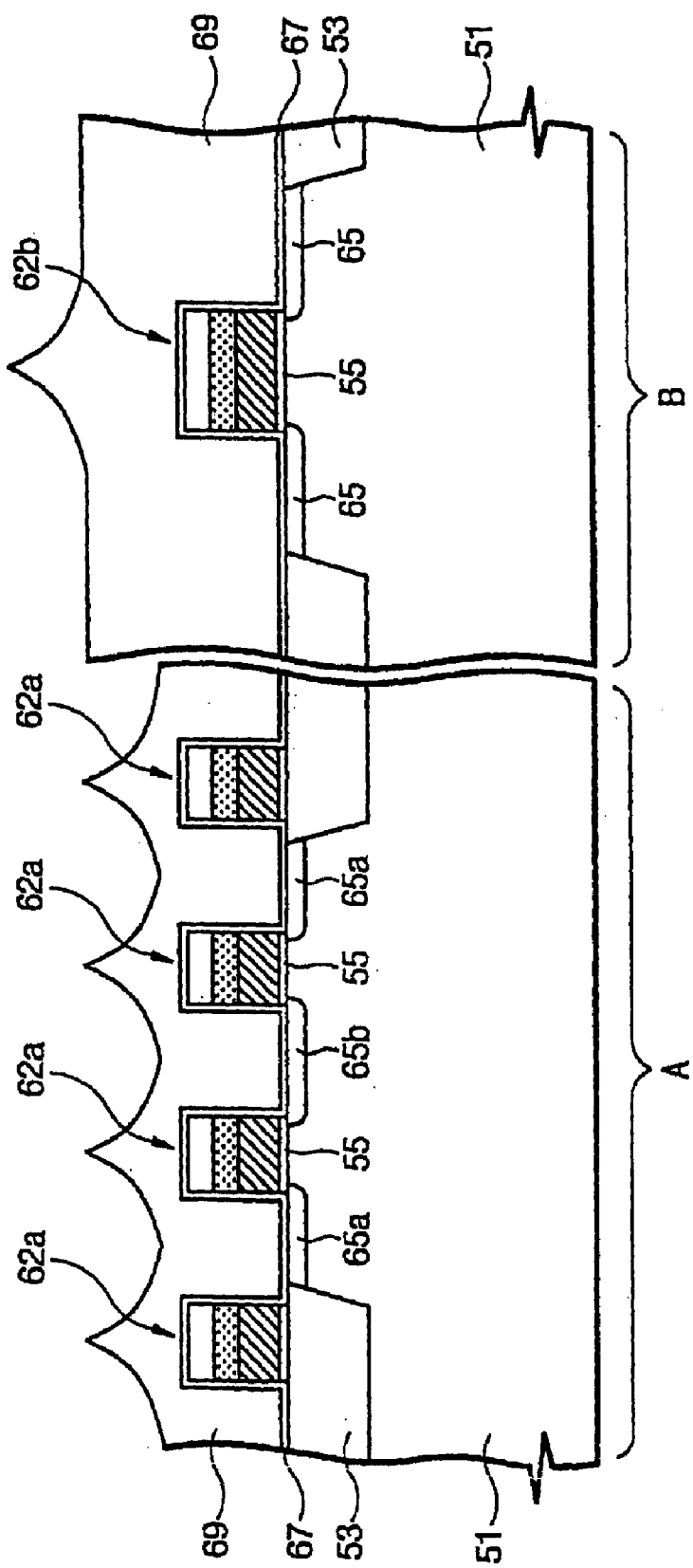

Referring now to FIG. 10, a sacrificial insulation layer 69 is formed on the entire surface of the resultant structure to fill up gap regions between the word line patterns 62a. Preferably, the sacrificial insulation layer 69 comprises an insulation material that exhibits a good filling characteristic and is formed at a temperature of 800° C. or lower to prevent degradation of the MOS transistors. Thus, the sacrificial insulation layer 69 may comprise a high-density plasma (HDP) oxide layer, a plasma-enhanced tetraethyl ortho silicate (PE-TEOS) layer, or an undoped silicate glass (USG) layer. When the sacrificial insulation layer 69 is made from borophosphosilicate glass (BSPG) that is re-flowed at a high temperature of approximately 850° C. to 950° C., the low concentration impurity regions 65, 65a, and 65b may be re-diffused to reduce the channel length of the transistors. The sacrificial insulation layer 69 is, therefore, most preferably made of a HDP oxide that is capable of filling the narrow and deep gap regions between the word line patterns 62a without voids at a temperature of 800° C. or lower.

To avoid the phenomenon in which the etch-stop layer 67 lifts from the substrate 51 during formation of the sacrificial insulation layer 69, the etch-stop layer 67 is preferably formed to a thickness of approximately 200 Å to 1000 Å. Although the etch-stop layer 67 may be thicker as compared with conventional self-aligned contact technology, contact pad resistance and alignment margins may nevertheless be improved as will be described hereinafter. Despite the increased thickness of the etch-stop layer 67 as compared with conventional self-aligned contact technology, the ion implanting operation for forming the low concentration impurity regions 65, 65a, and 65b may be performed after formation of the etch-stop layer 67.

Figure 11:
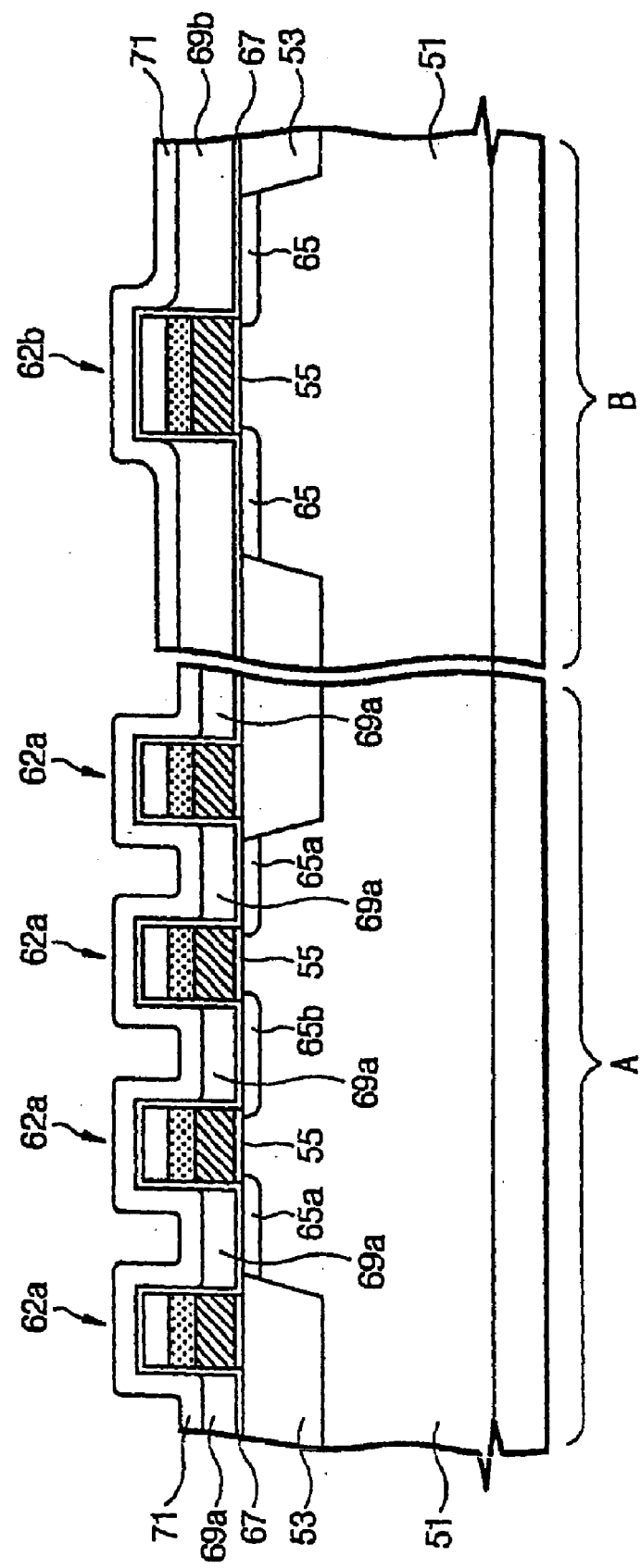

Referring now to FIG. 11, the sacrificial insulation layer 69 is etched back to form first sacrificial insulation layer patterns 69a in lower gap regions between the word line patterns 62a. Preferably, an isotropic etching process, such as a wet etching process, is used to etch back the sacrificial insulation layer 69. As a result of the etching operation, the etch-stop layer 67 on the top surfaces and the upper sidewalls of the word line patterns 62a is exposed as shown in FIG. 11. In the peripheral circuit region B, a second sacrificial insulation layer pattern 69b is formed such that the etch-stop layer 67 is exposed on the top surface and upper sidewall of the gate pattern 62b. Note, however, that if the sacrificial insulation layer 69 is made of HDP oxide, then an upper surface of the first sacrificial insulation layer pattern 69a may be lower than an upper surface of the second sacrificial insulation layer pattern 69b as shown in FIG. 11. This may be caused by a sputter etching process and a deposition process that are alternately and repeatedly carried out while performing a HDP process. The sputter etching process may exhibit a more efficient etching characteristic in a protrusion region than in a plane region as discussed hereinabove. Consequently, a HDP oxide layer formed on a high pattern density region (e.g., the first sacrificial insulation layer pattern 69a in the memory cell region A) may be thinner than that formed on a low pattern density region (e.g., the second sacrificial insulation layer pattern 69b in the peripheral circuit region B).

Figure 12:
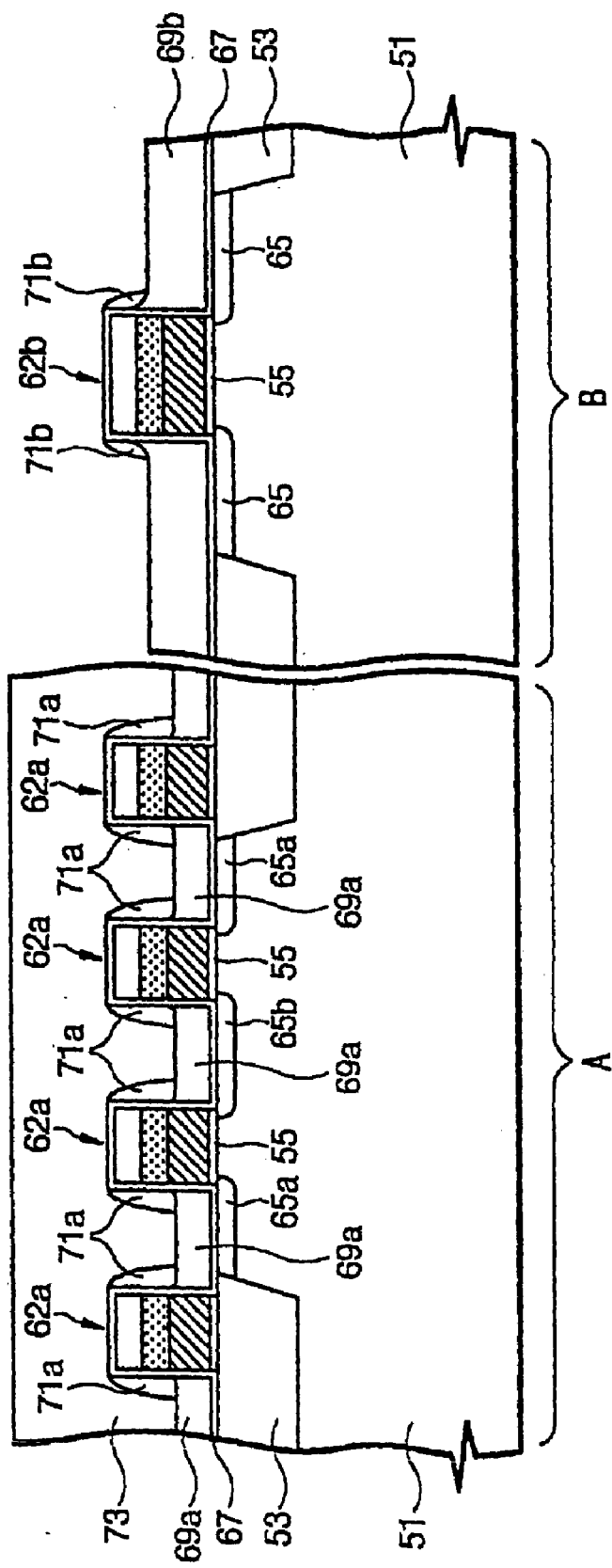

A conformal spacer insulation layer 71 is then formed on the resulting structure where the first and second sacrificial insulation layer patterns 69a and 69b are formed. Preferably, the spacer insulation layer 71 and the etch-stop layer 67 comprise the same material, such as silicon nitride (SiN). Referring now to FIG. 12, the spacer insulation layer 71 may be anisotropically etched to form first upper spacers 71a in an upper gap region between the pair of word line patterns 62a (i.e., on the upper sidewalls of the word line patterns 62a). In addition, a second upper spacer 71b is formed on the upper sidewalls of the gate pattern 62b. A second photoresist pattern 73 is then formed, which covers the memory cell region A.

Figure 13:
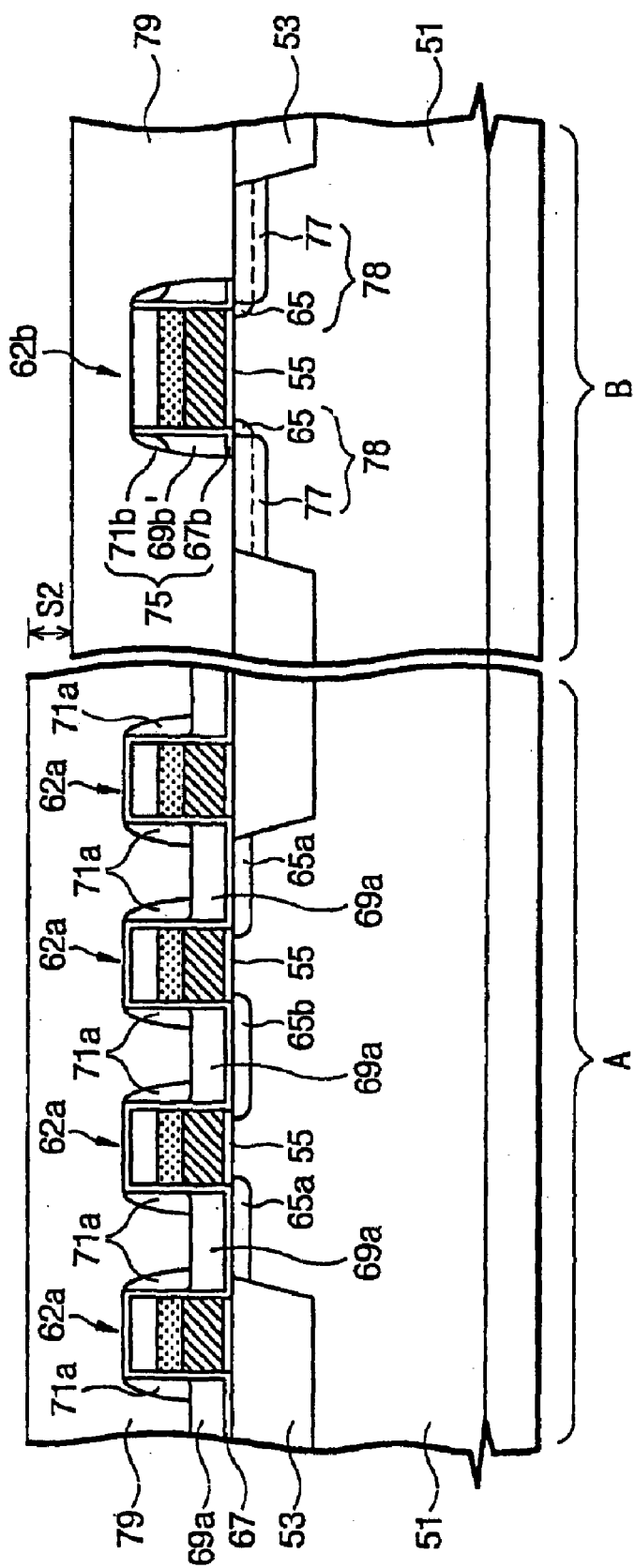

Referring now to FIG. 13, using the second photoresist pattern 73 shown in FIG. 12 as an etching mask, the second sacrificial insulation layer pattern 69b and the etch-stop layer 67 in the peripheral circuit region B are successively and anisotropically etched to form a spacer 75 on each sidewall of the gate pattern 62b. The spacer 75 comprises an etch-stop liner 67b that remains on the sidewall of the gate pattern 62b, the second upper spacer 71b, which is formed on the upper sidewall of the etch-stop liner 67b, and residue 69b' from the second sacrificial insulation layer 69b, which remains on the lower sidewall of the etch liner 67a as shown in FIG. 13.

Using the gate pattern 62b and the spacers 75 as ion implanting masks, N-type impurity ions, such as arsenic (As) ions, are implanted into the active region of the peripheral circuit region B, thereby forming high concentration impurity regions 77 on opposing sides of the gate pattern 62b. Preferably, the impurities are implanted using a high dose of approximately $1\times10^{14}$ to $1\times10^{16}$ ion atoms/cm$^2$. After forming the high concentration impurity regions 77, the second photoresist pattern 73 is removed.

An interlayer insulation layer 79 is formed on the entire surface of the resulting structure after removing the second photoresist pattern 73. The interlayer insulation layer 79 is preferably made from the same material as the sacrificial insulation layer 69 discussed hereinabove with respect to FIG. 10. This may reduce additional diffusion of impurities in the low concentration impurity regions 65a and 65b and the LDD-typed source/drain regions 78.

The interlayer insulation layer 79 may then be planarized. Advantageously, a global step difference S2 may be formed between the memory cell region A and the peripheral circuit region B. That is, a distance from an upper surface of the interlayer insulation layer 79 to the substrate 51 is greater in the memory cell region A than it is in the peripheral circuit region B. This step difference S2 is caused by the first sacrificial insulation layer patterns 69a that remain in the gap regions between the word line patterns 62a.

Figure 14A:
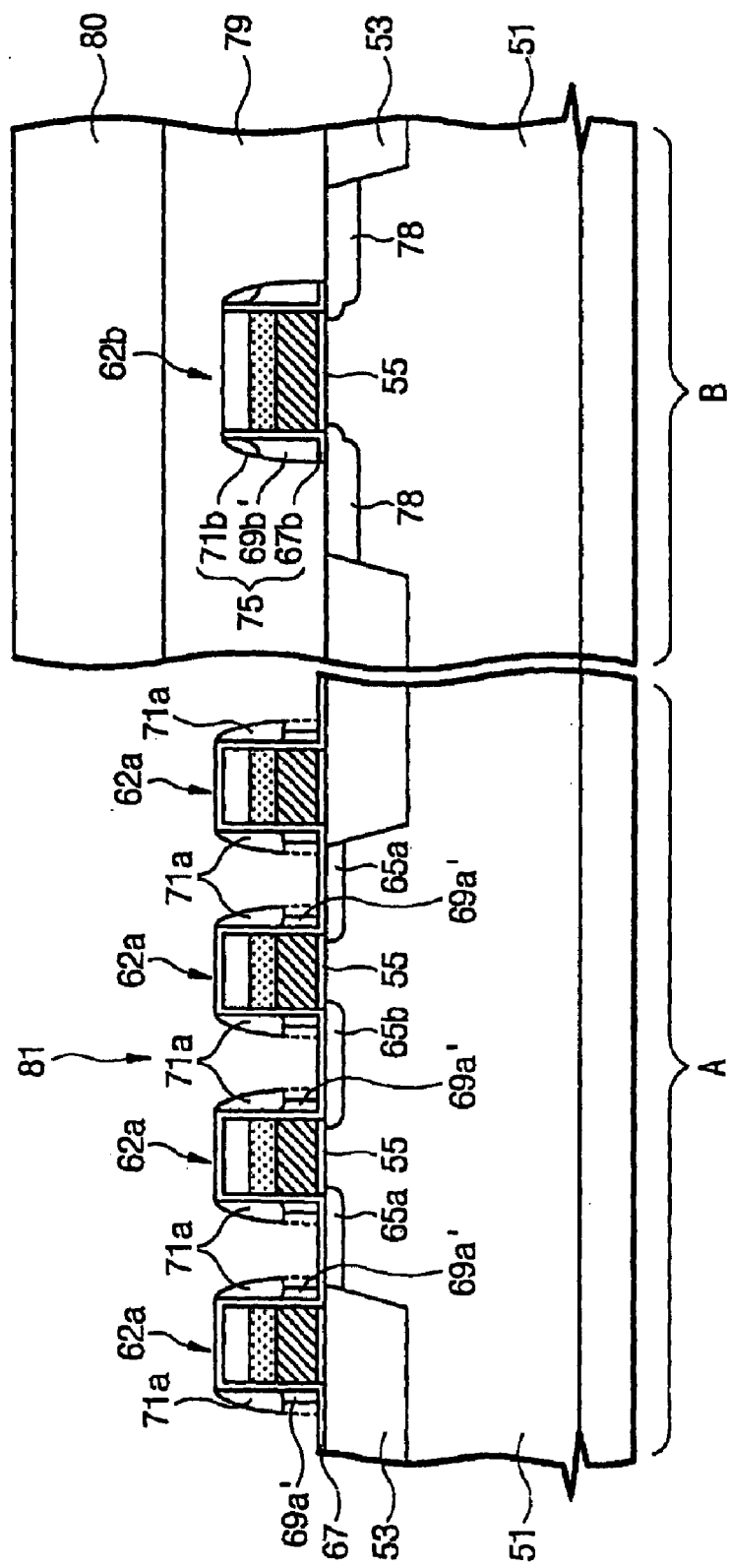
Figure 14B:
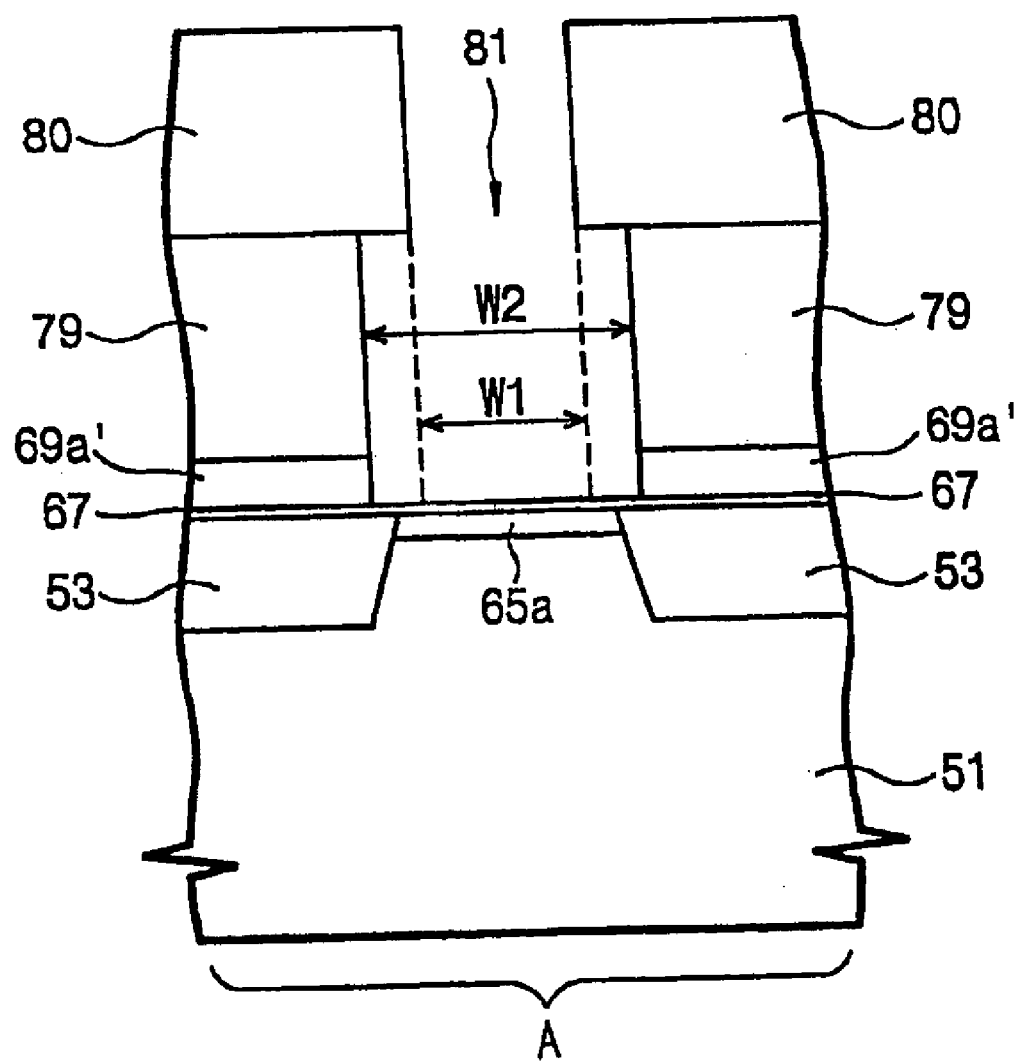
FIGS. 14B, 15B, 16B, and 17B are second cross-sectional views taken along line II—II of FIG. 1 of integrated circuit memory devices in various stages of manufacture in accordance with embodiments of the present invention.

Referring now to FIGS. 14A and 14B, a third photoresist pattern 80 is formed on the interlayer insulation layer 79 in the peripheral circuit region B using a photo mask on which the contact patterns 5 of FIG. 1 are drawn. Using the third photoresist pattern 80, the first upper spacers 71a, and the etch-stop layer 67 as etching masks, the interlayer insulation layer 79 and the first sacrificial insulation layer patterns 69 are anisotropically etched to form holes 81 that penetrate predetermined regions between the word line patterns 62a.

Figure 3:
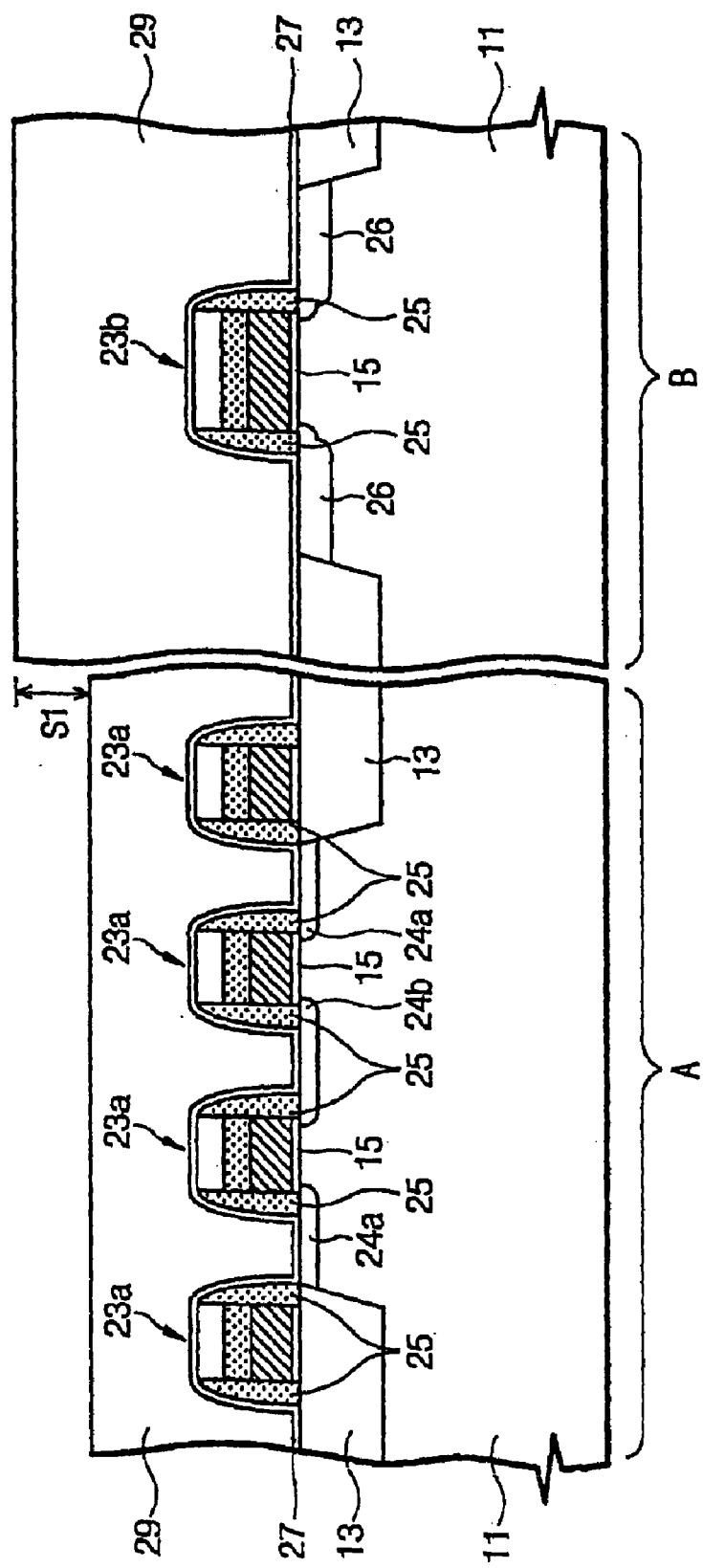
Figure 4A:
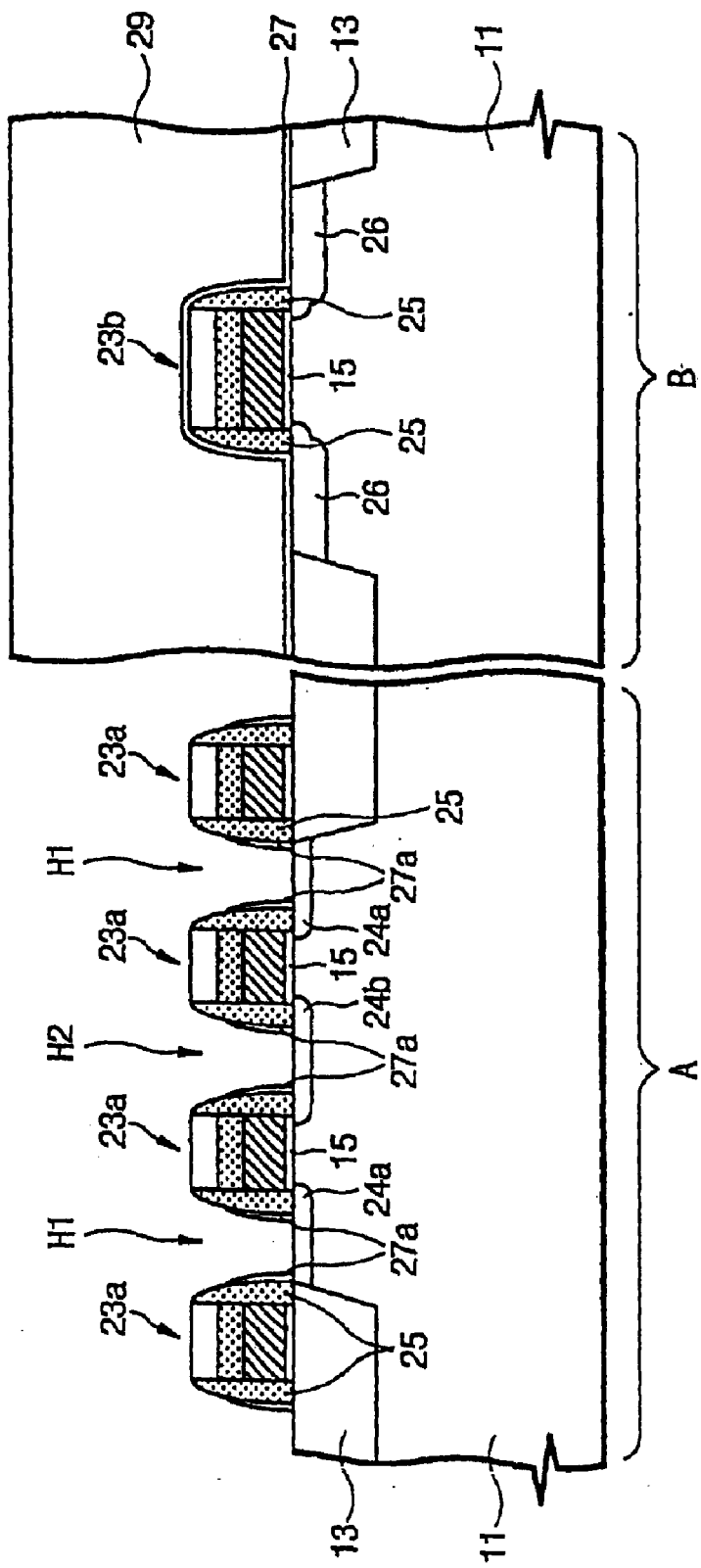
Figure 5:
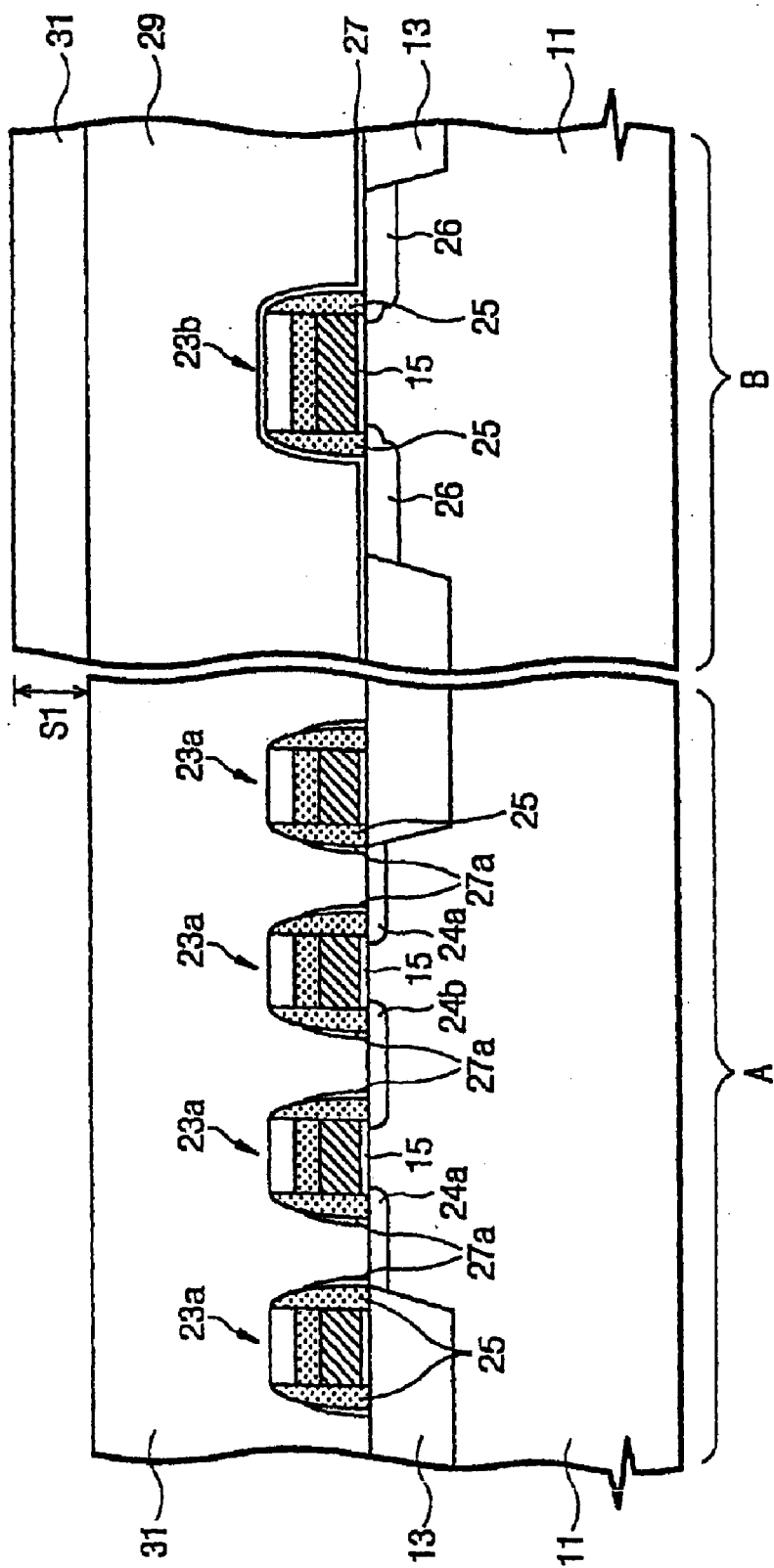
Figure 6:
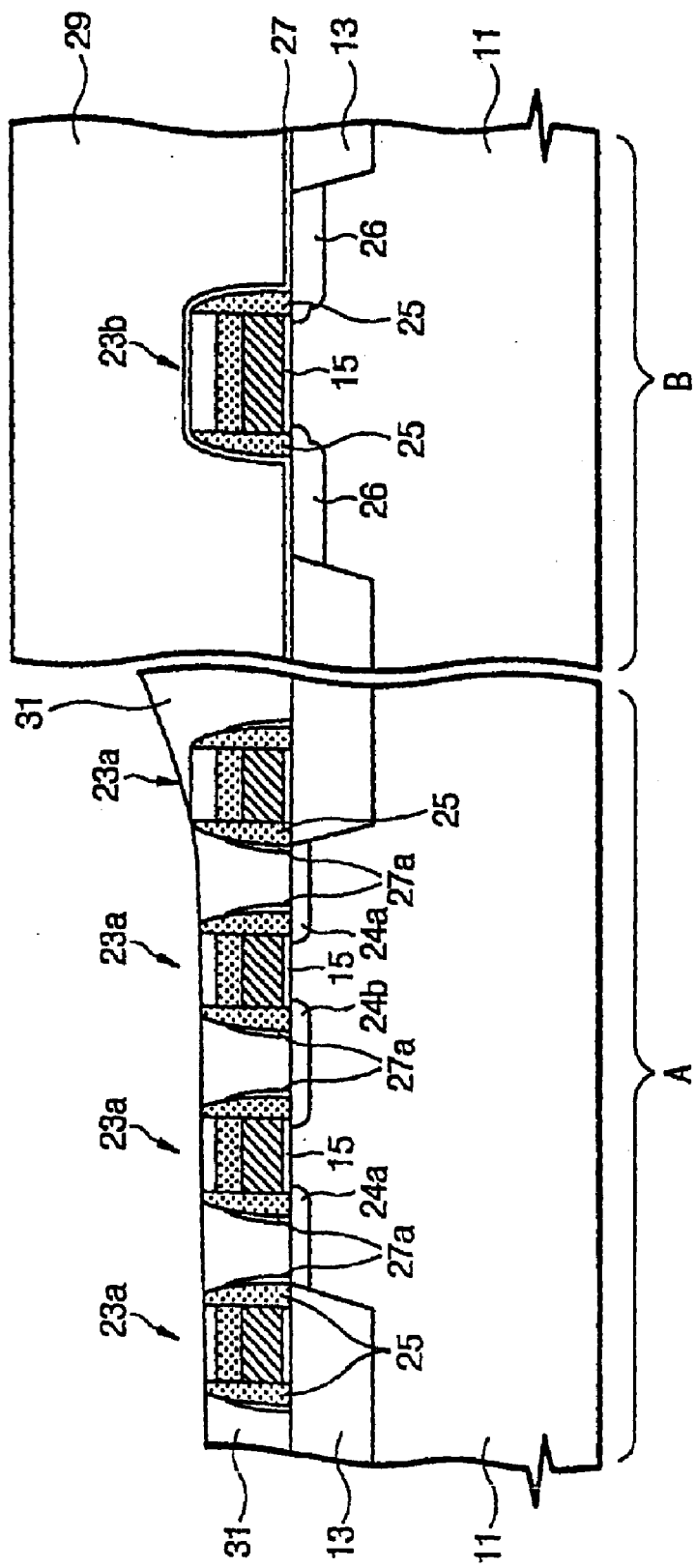
Figure 7:
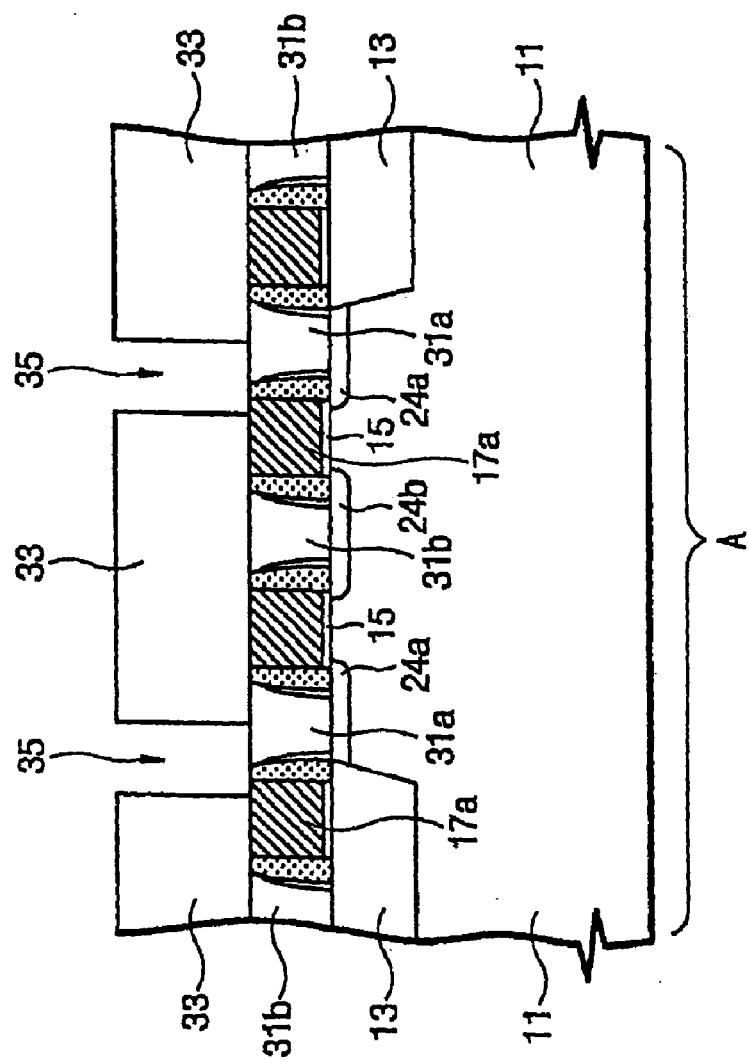

Advantageously, the etch-stop layer 67 may be thicker than that used in conventional self-aligned contact technology (e.g., the etch-stop layer 27 of FIG. 3). Exposure of the low concentration impurity regions 65a and 65b may therefore be avoided even if etching uniformity and selectivity are poor during the anisotropic etching process for forming the holes 81. In addition, exposure of the device isolation layer 53 may also be avoided, even if the third photoresist pattern 80 is misaligned along the X-axis of FIG. 1.

The first sacrificial insulation layer patterns 69a and the interlayer insulation layer 79, which are exposed by the holes 81, are isotropically etched to enlarge the holes 81. As a result, residues 69a' from the first sacrificial insulation layer patterns 69a may remain on the lower sidewalls of the word line patterns 62a in the lower gap regions between the word line patterns 62a. Alternatively, the first sacrificial insulation layer patterns 69a may be completely etched such that the etch-stop layer 67 is exposed on the lower sidewalls of the word line patterns 62a in the lower gap regions between the word line patterns 62a. As shown in FIG. 14B, because the width of the first sacrificial insulation layer pattern residues 69a' is smaller than that of the first upper spacers 71a, the final width W2 of the enlarged hole 81 is greater than an initial width W1 thereof. Preferably, the isotropic etching process is performed using hydrofluoric acid (HF) or buffered oxide etchant (BOE).

Figure 15A:
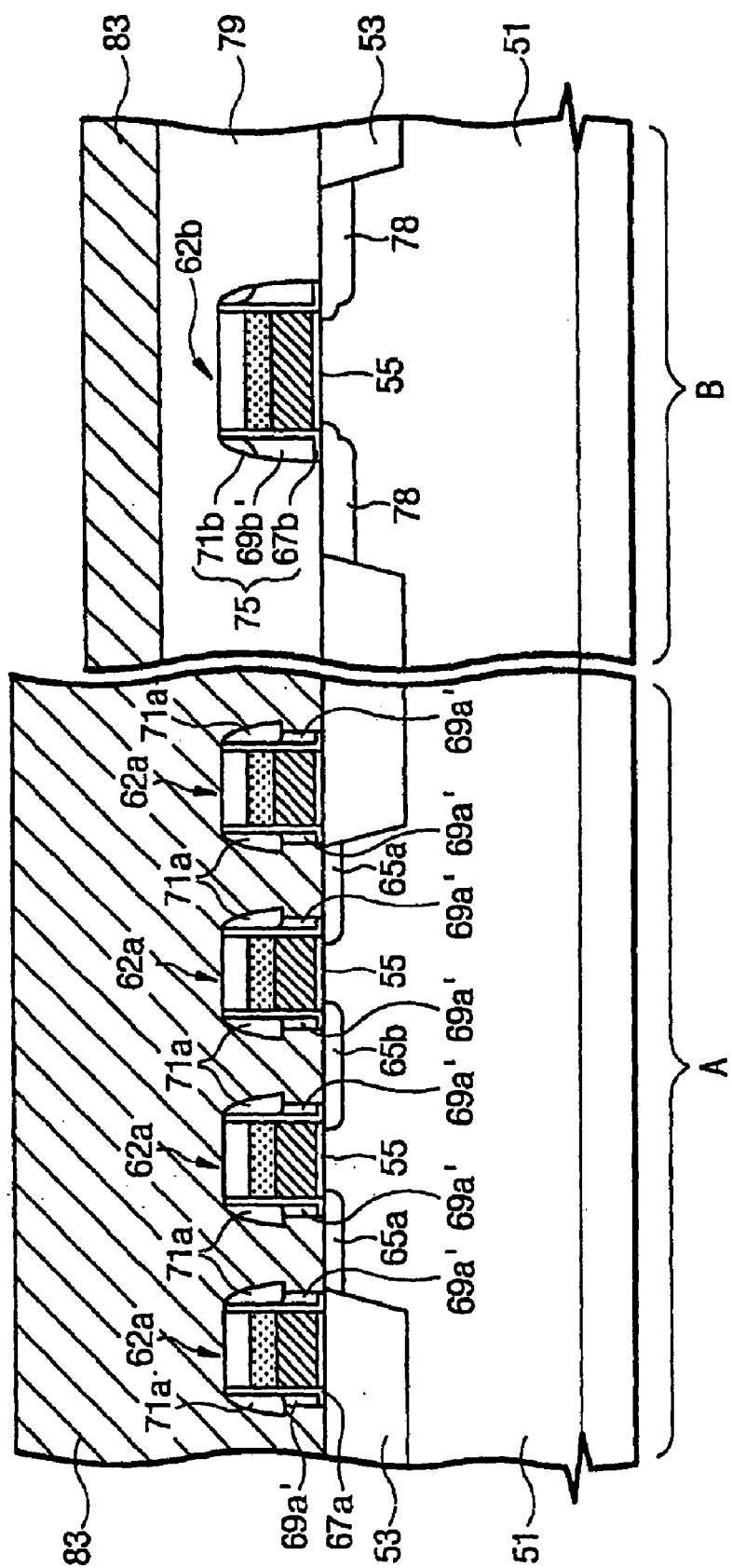
Figure 15B:
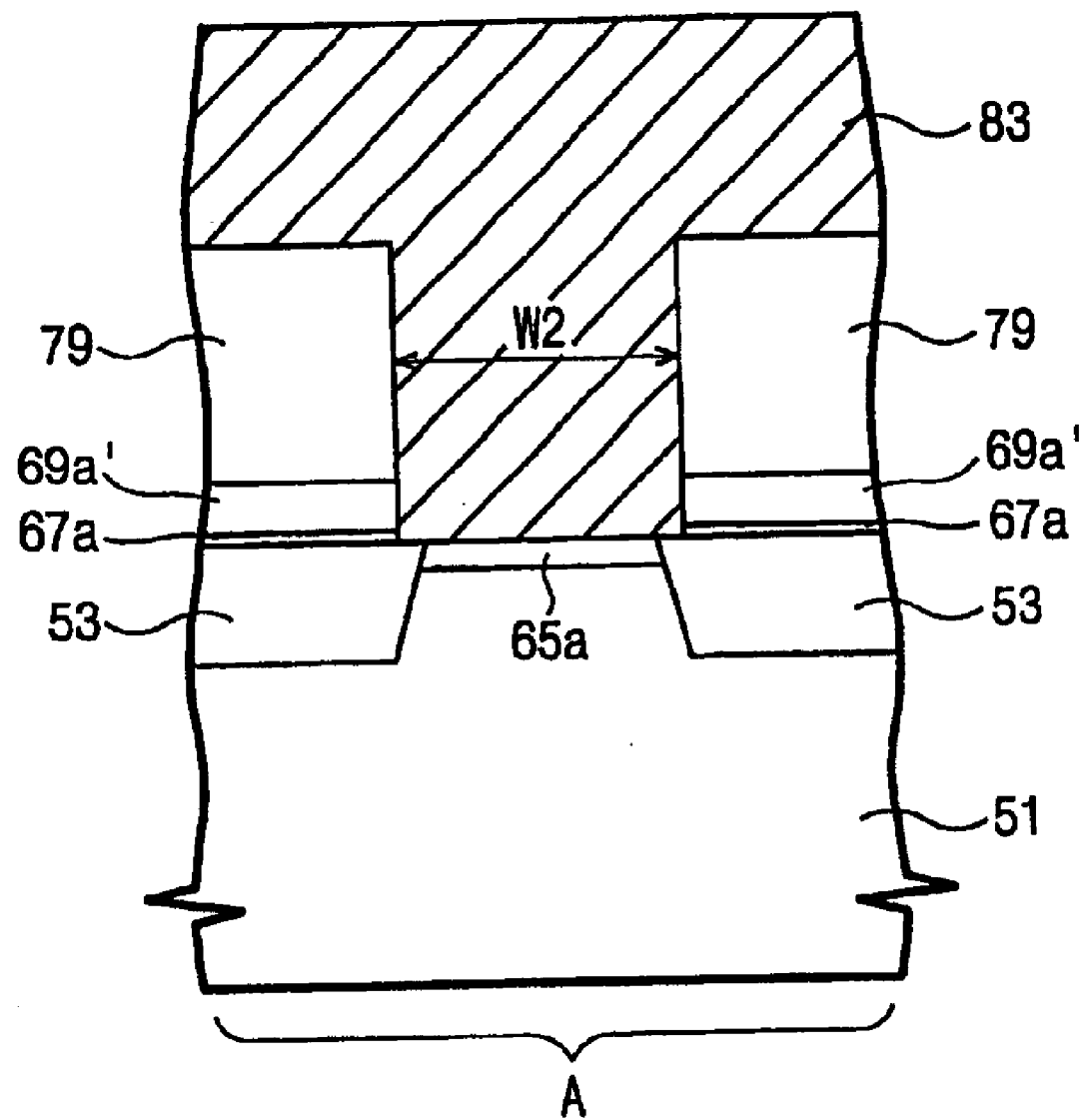

Referring now to FIGS. 15A and 15B, the third photoresist pattern 80 shown in FIGS. 14A and 14B is removed. The etch-stop layer 67, which is exposed at the bottom of the holes 81, is then etched to form self-aligned pad contact holes that expose the low concentration impurity regions 65a and 65b. An etch-stop liner 67a remains on the sidewalls of the word line patterns 62a and interposed between the sacrificial insulation layer pattern residues 69a' and the substrate 51. Although the device isolation layer 53 may be exposed by the self-aligned pad contact holes as shown in FIG. 15B, over etching of the exposed device isolation layer 53 may nevertheless be reduced by using an etchant that more readily etches the etch-stop layer 67 than the device isolation layer 53. Advantageously, even if misalignment occurs during the photolithographic procedures used to form the word line patterns 62a and the self-aligned pad contact holes, the areas of the low concentration impurity regions 65a and 65b that are exposed by the self-aligned contact holes may nevertheless be increased over that provided by conventional self-aligned contact technology. As a result, contact pad resistance may be reduced. Returning to FIG. 15A, a conductive layer 83 is formed on the entire surface of the resultant structure where the self-aligned pad contact holes are formed.

Figure 16A:
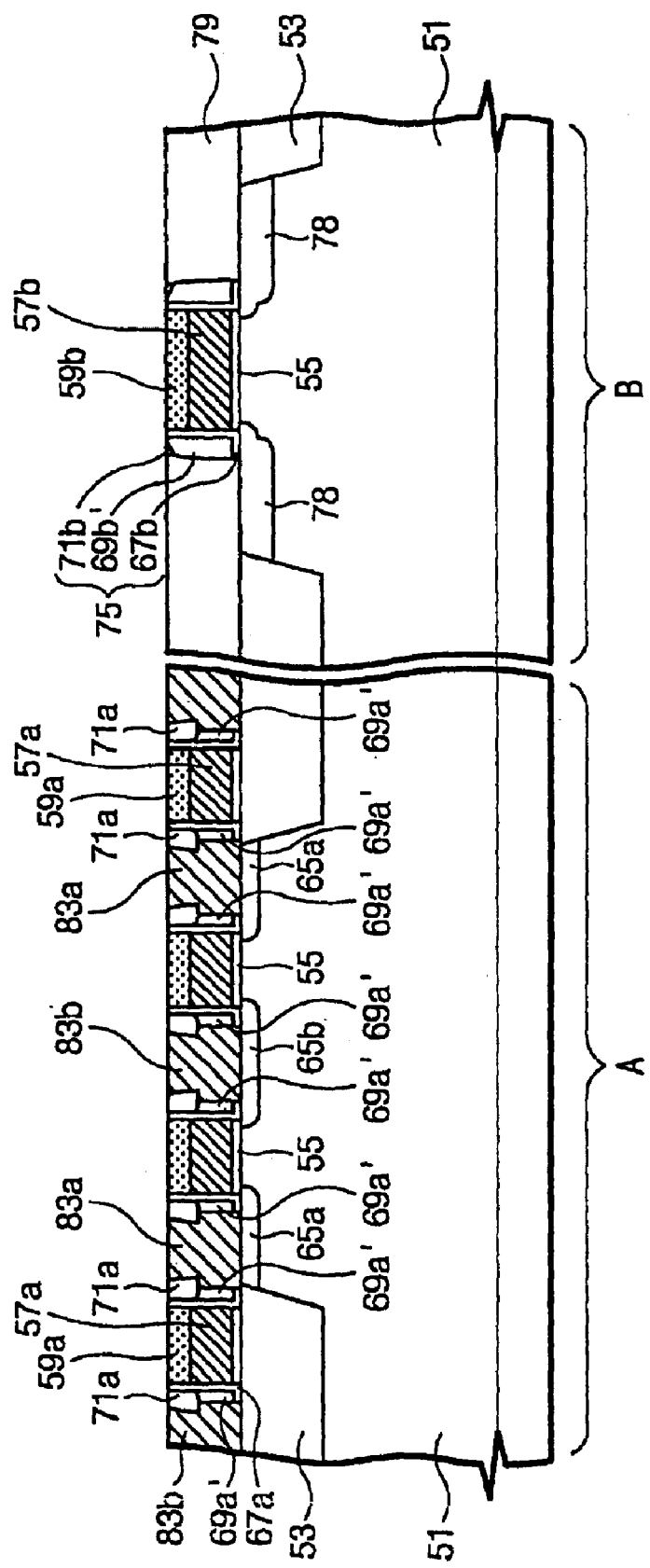
Figure 16B:
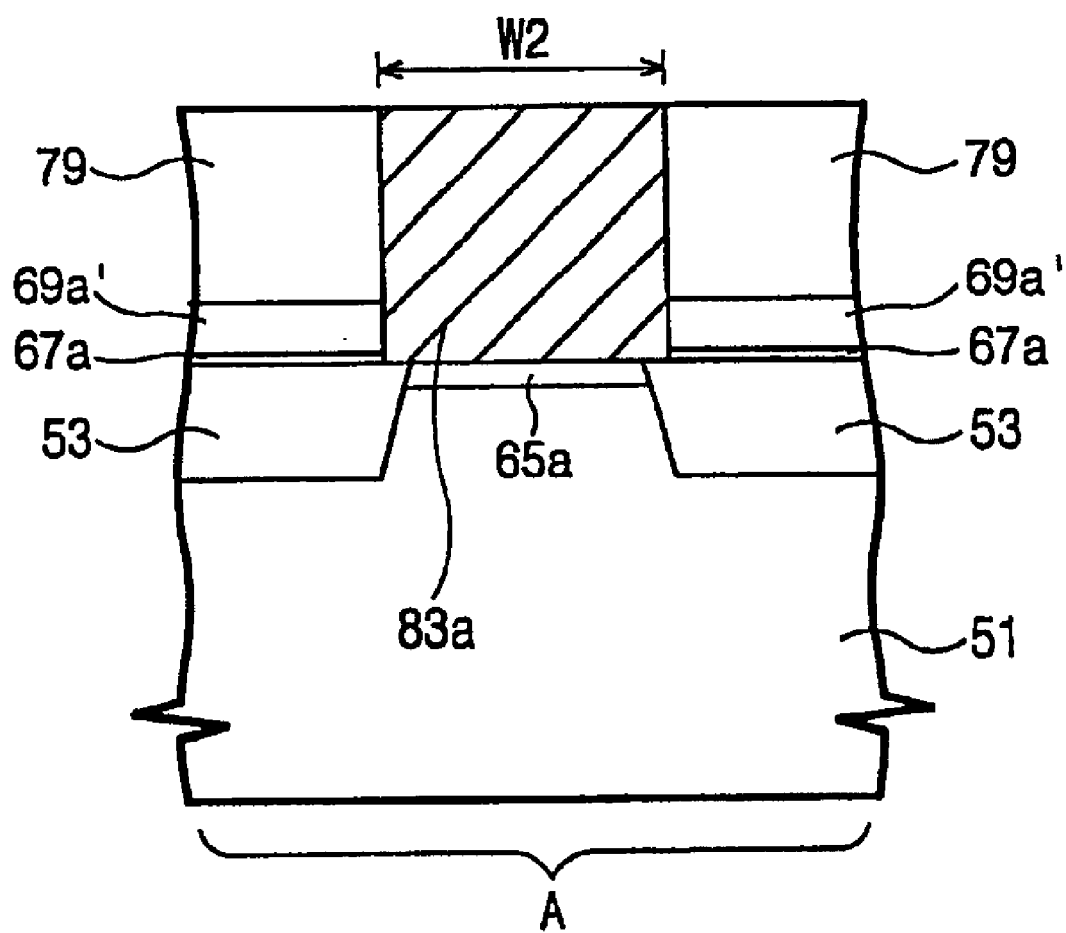

Referring now to FIGS. 16A and 16B, the conductive layer 83 and the interlayer insulation layer 79 are etched back until the capping insulation layer patterns 59a and the word line patterns 62a are exposed, thereby forming conductive pads 83a and 83b in the self-aligned pad contact holes. As shown in FIG. 16A, the conductive pads 83a and 83b are isolated from each other. The etch back process applied to the conductive layer 83 and the interlayer insulation layer 79 is preferably performed using chemical mechanical polishing (CMP) technology. In accordance with the present invention, it may be possible to reduce the effects of dishing in the memory cell region A. This is because a distance from an upper surface of the interlayer insulation layer 79 to the substrate 51 is greater in the memory cell region A than it is in the peripheral circuit region B as discussed hereinabove with respect to FIG. 13. Accordingly, it may be possible to avoid exposing the word lines 57a after formation of the conductive pads 83a and 83b. The conductive pad 83b, which is electrically connected to the common drain region 65b, may implement a bit line pad and the conductive pad 83a, which is electrically connected to the source region 65a, may implement a storage node pad.

To reduce parasitic capacitance between the conductive pads 83a, 83b, and the word lines 57a, it is preferable when etching the first sacrificial insulation layer patterns 69a to leave a residue 69a' under the first upper spacers 71a. Moreover, to reduce the parasitic capacitance between the word line 57a and the capping insulation layer pattern 59a, the first sacrificial insulation layer pattern 69a preferably overlaps an interface between the word line 57a and the capping insulation layer pattern 59a.

Figure 17A:
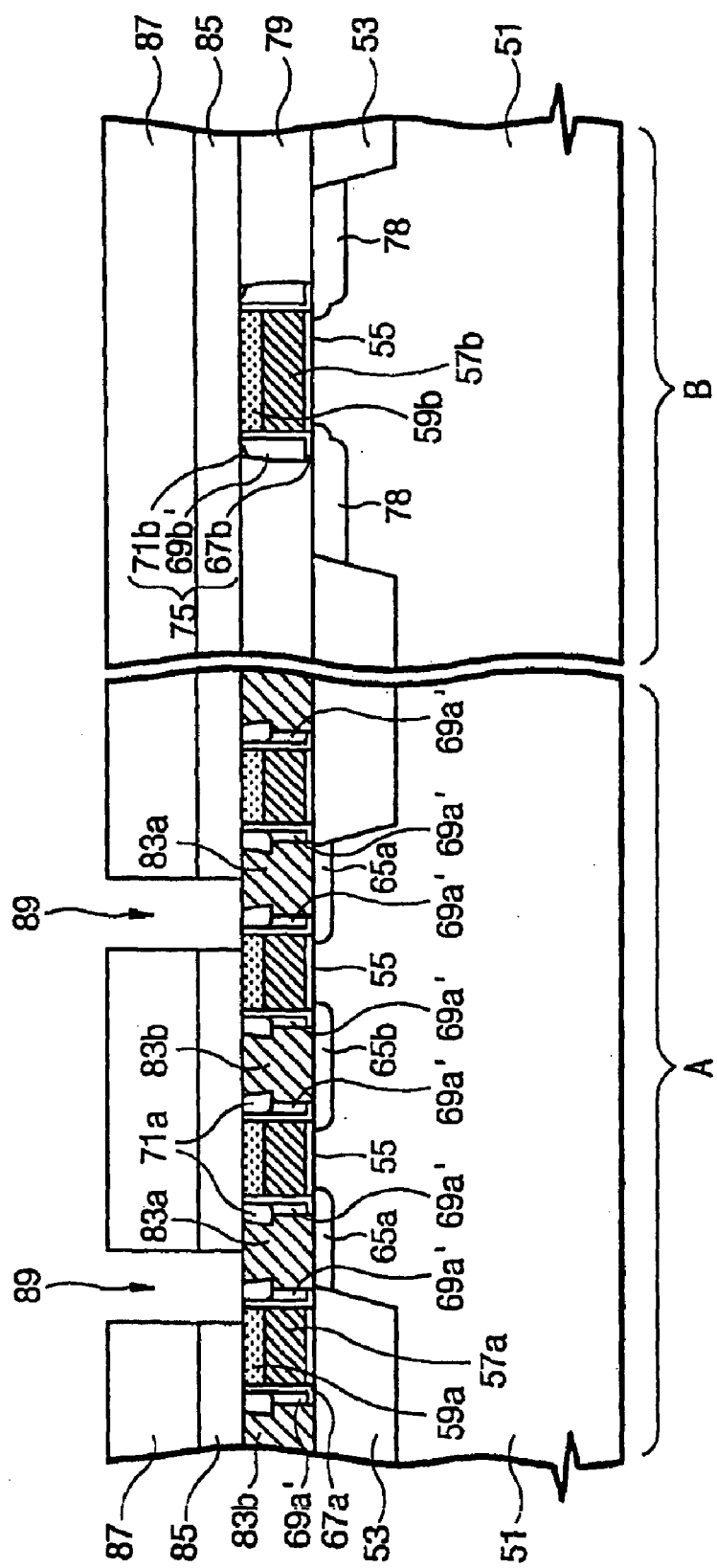
Figure 17B:
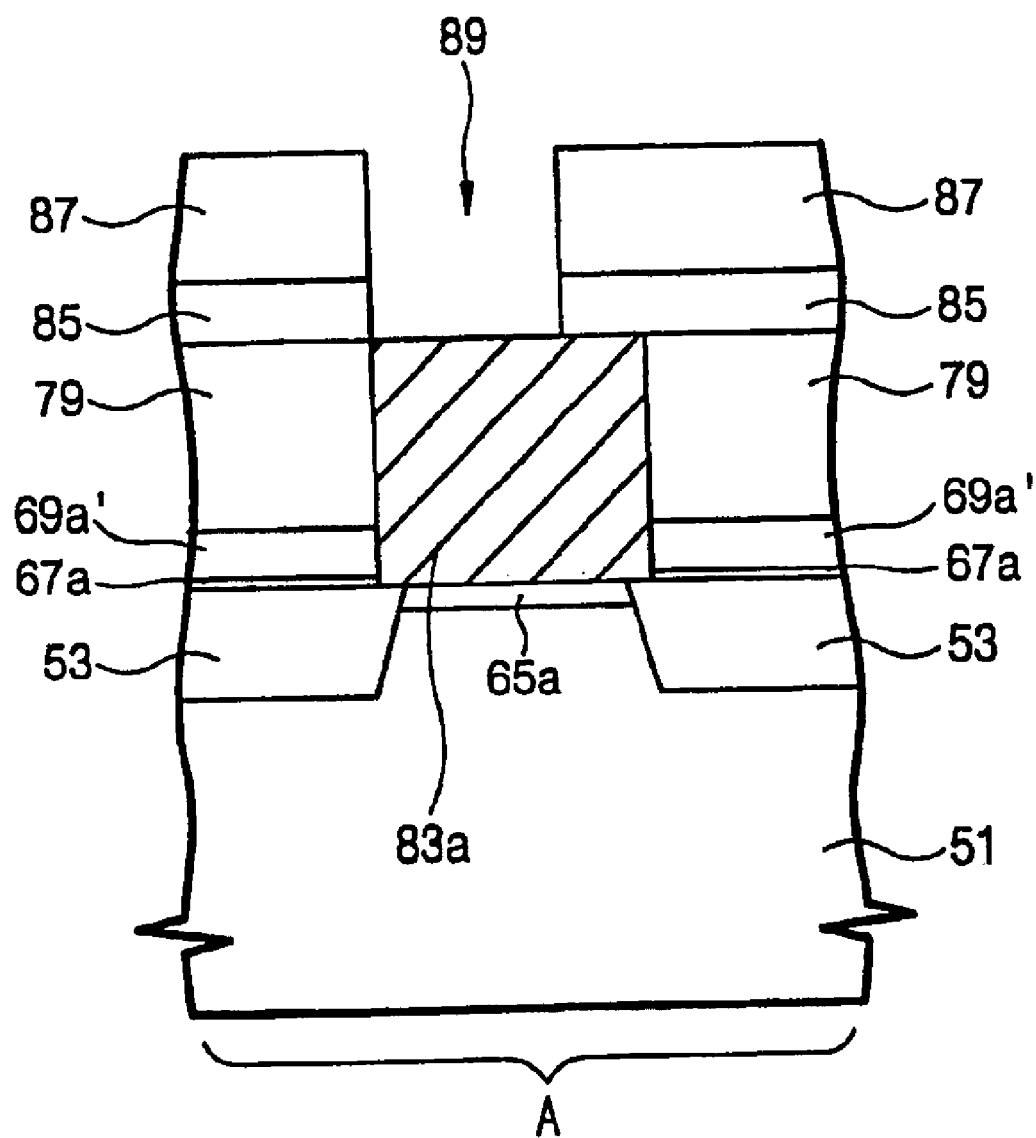

Referring now to FIGS. 17A and 17B, a first upper interlayer insulation layer 85 is formed on the entire surface of the resulting structure where the conductive pads 83a and 83b are formed. Although not shown in FIG. 17A, the first upper interlayer insulation layer 85 may be patterned to form bit line contact holes that expose the conductive pads 83b. A bit line may then be formed using conventional techniques. Next, a second upper interlayer insulation layer 87 is formed on the entire surface of the resulting structure where the bit line is formed. The second and first upper interlayer insulation layers 87 and 85 are successively patterned to form storage node contact holes 89 that expose the storage node conductive pads 83a. Even if the storage node contact holes 89 are misaligned relative to the conductive pads 83a and 83b, the probability that the word lines 57a and the interlayer insulation layer 79 are exposed may nevertheless be reduced because the present invention may lessen the effects of dishing during CMP etching of the conductive layer 83 and interlayer insulation layer 79 as discussed hereinabove with respect to FIGS. 16A and 16B.

Figure 18:
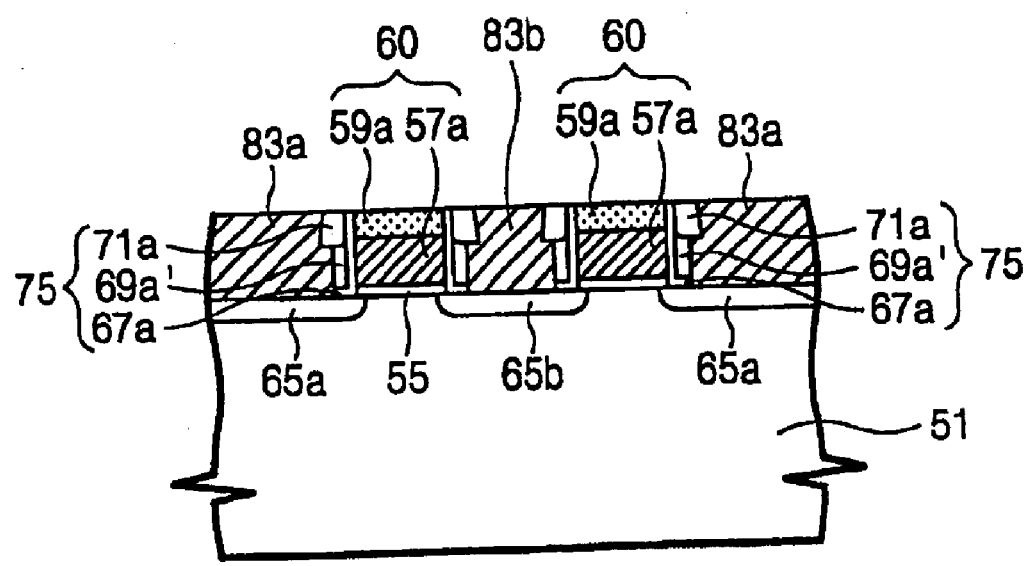
FIG. 18 is a cross-sectional view that illustrates integrated circuit memory devices having a self-aligned contact in accordance with embodiments of the present invention.

Self-aligned contact structures in accordance with the present invention will be discussed hereafter. Referring now to FIG. 18, a plurality of insulated interconnection patterns 60 (e.g., a plurality of insulated word line patterns) are disposed on the semiconductor substrate 51. The plurality of interconnection patterns 60 are substantially parallel with each other with each of the interconnection patterns 60 comprising an interconnection line (e.g., word line) 57a and a protection layer (e.g., capping insulation layer) pattern 59a that are sequentially stacked. The interconnection pattern typically comprises a conductive pattern. An insulation layer 55 may be interposed between each of the interconnection patterns 60 and the semiconductor substrate 51. Impurity regions 65a and 65b, having a conductivity type different than that of the semiconductor substrate 51, are formed in the semiconductor substrate 51 between the plurality of interconnection patterns 60.

Sidewalls of each of the interconnection patterns 60 are covered with a spacer 75, which comprises an etch-stop liner 67a, residue 69a' from a sacrificial insulation layer, and an upper spacer 71a. The etch-stop liner 67a is disposed directly on the sidewalls of the interconnection patterns 60 with the sacrificial insulation layer residue 69a' and the upper spacer 71a being disposed on the etch-stop liner 67a in lower sidewall and upper sidewall regions, respectively. Furthermore, an extended portion of the etch-stop liner 67a is interposed between the sacrificial insulation layer residue 69a' and the semiconductor substrate. As shown in FIG. 18, a gap between a pair of interconnection patterns 60 is wider near the semiconductor substrate 51 and is narrower remote from the semiconductor substrate 51. Advantageously, the exposed area of the impurity regions 65a and 65b may be increased, thereby allowing for improved contact pad resistance and alignment margins. Finally, the gaps between the interconnection patterns 60 are filled with conductive pads 83a and 83b, which are electrically connected to the impurity regions 65a and 65b, respectively.

From the foregoing it can readily be seen that, in accordance with the present invention, a high performance MOS transistor may be realized by forming the low concentration impurity regions 65a and 65b and the LDD-typed source/drain regions 78 in a semiconductor substrate 51 and then forming the sacrificial insulation layer 69 and interlayer insulation layer 79 at a low temperature. In addition, the width of the self-aligned contact hole near the low concentration impurity regions 65a and 65b may be enlarged without damaging the device isolation layer 53 and impurity regions 65a and 65b by using an etchant that more readily etches the etch-stop layer 67 than the device isolation layer 53 and impurity regions 65a and 65b. As a result, alignment margins of the word line patterns 62 and the storage node contact holes 89 may be increased and junction leakage current characteristics may be improved.

In concluding the detailed description, it should be noted that many variations and modifications can be made to the preferred embodiments without substantially departing from the principles of the present invention. All such variations and modifications are intended to be included herein within the scope of the present invention, as set forth in the following claims.

We claim:

1. An integrated circuit device, comprising:
    a substrate;
    an interconnection pattern having sidewalls disposed on the substrate; and
    a composite insulation layer that comprises a first material layer and a second material layer disposed on the sidewalls such that the first material layer is disposed in an upper sidewall region and the second material layer is disposed in a lower sidewall region between the first material layer and the substrate such that the first and the second material layers do not overlap, the first material layer being thicker than the second material layer.

2. An integrated circuit device as recited in claim 1, wherein the substrate comprises a semiconductor region disposed adjacent to the interconnection pattern.

3. An integrated circuit device, comprising:
    a substrate comprising a semiconductor region disposed adjacent to an interconnection pattern;
    the interconnection pattern having sidewalls disposed on the substrate;
    a composite insulation layer that comprises a first material layer and a second material layer disposed on the sidewalls such that the first material layer is disposed in an upper sidewall region and the second material layer is disposed in a lower sidewall region between the first material layer and the substrate, the first material layer being thicker than the second material layer; and
    a conductive pad that abuts against the composite insulation layer on one of the interconnection pattern sidewalls and engages the semiconductor region.

4. An integrated circuit device, comprising:
    a substrate;
    an interconnection pattern having sidewalls disposed on the substrate, the interconnection pattern comprising:
        a conductive layer; and
        a cap layer disposed on the conductive layer;

a gate insulation layer interposed between the conductive layer and the substrate; and a composite insulation layer that comprises a first material layer and a second material layer disposed on the sidewalls such that the first material layer is disposed in an upper sidewall region and the second material layer is disposed in a lower sidewall region between the first material layer and the substrate, the first material layer being thicker than the second material layer.

5. An integrated circuit device as recited in claim 4, wherein the second material layer overlaps an interface between the conductive layer and the cap layer.

6. An integrated circuit device as recited in claim 1, wherein the second material layer comprises a material selected from the group consisting of high density plasma (HDP) oxide, plasma-enhanced tetraethyl ortho silicate (PE-TEOS), and undoped silicate glass (USG).

7. An integrated circuit device, comprising:

a substrate;

an interconnection pattern having sidewalls disposed on the substrate; and a composite insulation layer that comprises a first material layer and a second material layer disposed on the sidewalls such that the first material layer is disposed in an upper sidewall region and the second material layer is disposed in a lower sidewall region between the first material layer and the substrate, the first material layer being thicker than the second material layer;

wherein the first material layer comprises silicon nitride (SiN).

* * * * *